(12) United States Patent  
Sivaram et al.

(10) Patent No.: US 8,481,845 B2
(45) Date of Patent: Jul. 9, 2013

(54) METHOD TO FORM A PHOTOVOLTAIC CELL COMPRISING A THIN LAMINA

(75) Inventors: Srinivasan Sivaram, Monte Sereno, CA (US); Aditya Agarwal, Sunnyvale, CA (US); S. Brad Herner, San Jose, CA (US); Christopher J. Petti, Mountain View, CA (US)

(73) Assignee: GTAT Corporation, Nashua, NH (US)

( * ) Notice: Subject to any disclaimer, the term of this patent is extended or adjusted under 35 U.S.C. 154(b) by 213 days.

(21) Appl. No.: 12/026,530

(22) Filed: Feb. 5, 2008

(65) Prior Publication Data

US 2009/0194162 A1    Aug. 6, 2009

(51) Int. Cl.
*H01L 31/00* (2006.01)
*H01L 21/00* (2006.01)

(52) U.S. Cl.
USPC ............................................ 136/256; 438/57

(58) Field of Classification Search
USPC ................ 427/74; 136/244, 249, 256; 438/57
See application file for complete search history.

(56) References Cited

U.S. PATENT DOCUMENTS

| | | | |
|---|---|---|---|
| 3,480,473 A * | 11/1969 | Tanos | 427/74 |
| 4,084,985 A | 4/1978 | Evans, Jr. | |
| 4,144,096 A * | 3/1979 | Wada et al. | 136/249 |
| 4,171,997 A | 10/1979 | Irmler | |
| 4,174,451 A | 11/1979 | Jarque et al. | |
| 4,200,472 A * | 4/1980 | Chappell et al. | 136/246 |
| 4,240,842 A | 12/1980 | Lindmayer | |
| 4,315,097 A * | 2/1982 | Solomon | 136/255 |
| 4,338,481 A | 7/1982 | Mandelkorn | |
| 4,450,316 A | 5/1984 | Hamakawa et al. | |
| 4,499,658 A | 2/1985 | Lewis | |
| 4,578,526 A | 3/1986 | Nakano et al. | |
| 4,830,038 A | 5/1989 | Anderson et al. | |
| 4,836,861 A * | 6/1989 | Peltzer et al. | 136/246 |
| 4,897,123 A | 1/1990 | Mitsui | |
| 5,034,068 A | 7/1991 | Glenn et al. | |
| 5,057,163 A | 10/1991 | Barnett et al. | |
| 5,273,911 A | 12/1993 | Sasaki et al. | |

(Continued)

FOREIGN PATENT DOCUMENTS

| | | |
|---|---|---|
| JP | 2001077044 A | 3/2001 |
| JP | 2003017723 A | 1/2003 |
| JP | 2007250575 A | 9/2007 |
| WO | 03003434 A1 | 1/2003 |

OTHER PUBLICATIONS

Rinke, T.J. et al., "Quasi-monocrystalline silicon for thin-film devices", May 1999, Applied Physics A, DOI 10.1007/s003399900078, pp. 705-707.*

(Continued)

*Primary Examiner* — Jonathan Johnson
*Assistant Examiner* — Tamir Ayad
(74) *Attorney, Agent, or Firm* — The Mueller Law Office, P.C.

(57) ABSTRACT

A very thin photovoltaic cell is formed by implanting gas ions below the surface of a donor body such as a semiconductor wafer. Ion implantation defines a cleave plane, and a subsequent step exfoliates a thin lamina from the wafer at the cleave plane. A photovoltaic cell, or all or a portion of the base or emitter of a photovoltaic cell, is formed within the lamina. In preferred embodiments, the wafer is affixed to a receiver before the cleaving step. Electrical contact can be formed to both surfaces of the lamina, or to one surface only.

8 Claims, 15 Drawing Sheets

U.S. PATENT DOCUMENTS

| | | | |
|---|---|---|---|
| 5,279,682 A * | 1/1994 | Wald et al. | 136/256 |
| 5,374,564 A | 12/1994 | Bruel | |
| 5,626,688 A | 5/1997 | Probst et al. | |
| 5,966,620 A | 10/1999 | Sakaguchi et al. | |
| 5,985,742 A * | 11/1999 | Henley et al. | 438/515 |
| 6,048,411 A * | 4/2000 | Henley et al. | 148/33.5 |
| 6,107,213 A | 8/2000 | Tayanaka | |
| 6,146,979 A | 11/2000 | Henley et al. | |
| 6,184,111 B1 | 2/2001 | Henley et al. | |
| 6,190,937 B1 | 2/2001 | Nakagawa et al. | |
| 6,225,192 B1 | 5/2001 | Aspar et al. | |
| 6,229,165 B1 * | 5/2001 | Sakai et al. | 257/291 |
| 6,262,358 B1 | 7/2001 | Kamimura et al. | |
| 6,331,208 B1 | 12/2001 | Nishida et al. | |
| 6,403,877 B2 * | 6/2002 | Katsu | 136/255 |
| 6,500,690 B1 | 12/2002 | Yamagishi et al. | |
| 6,518,596 B1 * | 2/2003 | Basore | 257/69 |
| 6,530,653 B2 | 3/2003 | Le et al. | |
| 6,534,382 B1 | 3/2003 | Sakaguchi et al. | |
| 6,563,133 B1 | 5/2003 | Tong | |
| 6,690,014 B1 | 2/2004 | Gooch et al. | |
| 6,825,104 B2 | 11/2004 | Horzel et al. | |
| 7,019,339 B2 | 3/2006 | Atwater, Jr. et al. | |
| 7,056,815 B1 | 6/2006 | Weng et al. | |
| 7,238,622 B2 | 7/2007 | Atwater, Jr. et al. | |
| 7,462,774 B2 | 12/2008 | Roscheisen et al. | |
| 7,591,712 B2 | 9/2009 | Morikawa et al. | |
| 7,700,878 B2 * | 4/2010 | Antaya et al. | 174/72 A |
| 2002/0132449 A1 | 9/2002 | Iwasaki et al. | |
| 2003/0134489 A1 | 7/2003 | Schwarzenbach et al. | |
| 2004/0200520 A1 * | 10/2004 | Mulligan et al. | 136/256 |
| 2004/0206390 A1 | 10/2004 | Bhattacharya | |
| 2005/0000561 A1 * | 1/2005 | Baret et al. | 136/244 |
| 2006/0021565 A1 | 2/2006 | Zahler et al. | |
| 2006/0208341 A1 | 9/2006 | Atwater, Jr. et al. | |
| 2007/0135013 A1 | 6/2007 | Faris | |
| 2007/0235074 A1 | 10/2007 | Henley et al. | |
| 2007/0277874 A1 | 12/2007 | Dawson-Elli et al. | |
| 2008/0023061 A1 | 1/2008 | Clemens et al. | |
| 2008/0070340 A1 | 3/2008 | Borrelli et al. | |
| 2008/0160661 A1 | 7/2008 | Henley | |
| 2008/0179547 A1 | 7/2008 | Henley | |
| 2008/0188011 A1 | 8/2008 | Henley | |
| 2009/0042369 A1 | 2/2009 | Henley | |
| 2009/0061557 A1 | 3/2009 | Akiyama et al. | |

OTHER PUBLICATIONS

Brendel, Rolf, "Thin-film crystalline silicon mini-modules using porous Si for layer transfer", 2004, Solar Energy 77, pp. 969-982.*
Office Action dated Oct. 8, 2009 for U.S. Appl. No. 12/208,298.
Office Action dated Aug. 21, 2009 for U.S. Appl. No. 12/208,392.
Office Action dated Oct. 29, 2009 for U.S. Appl. No. 12/208,396.
Office Action dated Jul. 13, 2009 for U.S. Appl. No. 12/209,364.
Amin, Nowshad et al., "Highly Efficient 1 Micron Thick CdTe Solar Cells with Textured TCOs", 2001, Solar Energy Materials & Solar Cells, 67, pp. 195-201.
Office Action dated Jul. 12, 2010 for U.S. Appl. No. 12/208,298.
Office Action dated Jul. 29, 2010 for U.S. Appl. No. 12/208,392.
Notice of Allowance and Fee(s) Due dated Oct. 19, 2010 for U.S. Appl. No. 12/208,392.
Office Action dated Dec. 27, 2010 for U.S. Appl. No. 12/208,298.
Notice of Allowance dated Nov. 14, 2011 for U.S. Appl. No. 12/189,157.
Office Action dated Aug. 24, 2011 for U.S. Appl. No. 12/189,157.
Office Action dated Nov. 14, 2011 for U.S. Appl. No. 12/343,420.
Office Action dated Oct. 28, 2011 for U.S. Appl. No. 12/499,294.
Extended European Search Report (filed on Feb. 21, 2011 for EPO Application No. 09152012.2.
Extended European Search Report filed on Feb. 21, 2011 for EPO Application No. 09152007.2.
Office Action dated Apr. 5, 2011 for U.S. Appl. No. 12/189,157.
Office Action dated Mar. 21, 2011 for U.S. Appl. No. 12/499,294.
Notice of Allowance and Fees Due dated Jun. 19, 2012 for U.S. Appl. No. 12/499,294.
Notice of Allowance and Fees Due dated Sep. 5, 2012 for U.S. Appl. No. 12/729,878.
Office Action dated Jun. 13, 2012 for U.S. Appl. No. 12/208,298.
Supplemental Notice of Allowance and Fees Due dated Jul. 19, 2012 for U.S. Appl. No. 12/499,294.
Bergmann, et al. "Thin film solar cells on glass by transfer of monocrystalline Si films", 1999, International Journal of Photoenergy, ,vol. 1, pp. 1-5.
Notice of Allowance dated Apr. 6, 2012 for U.S. Appl. No. 12/343,420.
Office Action dated Mar. 1, 2012 for U.S. Appl. No. 12/499,294.
Agarwal et al. In "Efficient production of silicon-on-insulator films by co-implantation of He+ with H+", Amer. Inst. of Physics, vol. 72, No. 9, pp. 1086-1088, Mar. 1998.
De Ceuster et al., "Low Cost, high vol. production of >22% efficiency silicon solar cells," Proc. 22nd EUPVSEC, 2007, p. 816-819.
Mulligan et al., "Reducing Silicon Consumption by Leveraging Cell Efficiency," Proc. 21st EUPVSEC, 2006, pp. 1301-1302.
Mulligan et al., "Manufacture of Solar Cells with 21% Efficency," http://www.sunpowercorp.com/Smarter-Solar/The-SunPower-Advantage/~/media/Downloads/smarter_solar/bmpaper.ashx, Jun. 2004.
Saadatmand et al., "Radiation Emission from Ion Implanters When Implanting Hydrogen and Deuterium," Proc. 1998 Intl. Conf. on Ion Implantation Tech., pp. 292-295, 1999.
Griggs et al., "Design Approaches and Materials Processes for Ultrahigh Efficiency Lattice Mismatched Multi-junction Solar Cells," Proc. 4th WCPEC, Waikoloa, HA, 2006.
Smith et al., "Review of Back Contact Silicon Solar Cells for Low Cost Application," 16th EUPVSEC, 2000.
Taguchi et al., "An approach for the higher efficiency of HIT cells," Proc. IEEE-31, 31st IEEE Photovoltaics Spec. Conf., Orlando, USA, Jan 2005.
Zhao et al., "Twenty-four percent efficient silicon solar cells with double layer antireflection coatings and reduced resistance loss," Appl Phys. Lett. 66 (26) Jun. 1995.
Poortmans, Jeff et al., "Thin Film Solar Cells: Fabrication, Characterization and applications", 2006, John Wiley & Sons Ltd, p. 72.
Singh, Jasprit; Semiconductor Devices: Basic Principles: Chapter 7: John Wiley 2001.
Tihu Wang, NREL (National Renewable Energy Laboratory) of US Department of Energy, (2006).
Office Action dated Mar. 12, 2010 for U.S. Appl. No. 12/208,298.
Office Action dated Mar. 9, 2010 for U.S. Appl. No. 12/208,392.
Office Action dated Mar. 25, 2010 for U.S. Appl. No. 12/208,396.
Office Action dated Feb. 8, 2010 for U.S. Appl. No. 12/209,364.
Office Action dated Apr. 1, 2010 for U.S. Appl. No. 12/189,157.
Office Action dated Mar. 15, 2013 for U.S. Appl. No. 12/750,635.
Second Office Action dated Dec. 25, 2012 for Chinese Application No. 200910000496.1.

* cited by examiner

METHOD TO FORM A PHOTOVOLTAIC CELL COMPRISING A THIN LAMINA

BACKGROUND OF THE INVENTION

The invention relates to a method to form a thin semiconductor lamina for use in a photovoltaic cell.

Conventional photovoltaic cells are most commonly formed from silicon wafers. Typically such wafers are sliced from an ingot of silicon. Current technology does not allow wafers of less than about 170 microns thick to be fabricated into cells economically, and at this thickness a substantial amount of silicon is wasted in cutting loss, or kerf. Silicon solar cells need not be this thick to be effective or commercially useful. A large portion of the cost of conventional solar cells is the cost of silicon feedstock.

There is a need, therefore, for a method to form a thinner crystalline semiconductor photovoltaic cell cheaply and reliably.

SUMMARY OF THE PREFERRED EMBODIMENTS

The present invention is defined by the following claims, and nothing in this section should be taken as a limitation on those claims. In general, the invention is directed to a thin semiconductor lamina for use in a photovoltaic cell and methods for making such a cell.

A first aspect of the invention provides for a method for forming a photovoltaic cell, the method comprising: providing a contiguous, monolithic semiconductor donor body having a first donor thickness; and cleaving a portion of the contiguous, monolithic semiconductor donor body to form a first lamina of semiconductor material, wherein the first lamina of semiconductor material has a first lamina thickness, the first lamina thickness between about 0.2 micron and about 100 microns thick; and fabricating the photovoltaic cell, wherein the first lamina of semiconductor material comprises at least a portion of the base or of the emitter, or both, of the photovoltaic cell.

Another aspect of the invention provides for a method for fabricating a photovoltaic cell, the method comprising: implanting hydrogen ions into a semiconductor donor body through a first surface of the semiconductor donor body, wherein ion implantation defines a cleave plane at a depth below the first surface of between about 0.2 micron and about 100 microns; cleaving a lamina of semiconductor material from the donor body along the cleave plane; and fabricating the photovoltaic cell, wherein the lamina comprises at least a portion of the base or of the emitter, or both, of the photovoltaic cell.

Still another aspect of the invention provides for a method for fabricating a photovoltaic cell, the method comprising: affixing a first surface of a first contiguous, monolithic semiconductor donor body to a receiver; after the affixing step, cleaving a first lamina of semiconductor material from the first donor body, wherein the first lamina of semiconductor material includes the first surface and remains affixed to the receiver, and fabricating the photovoltaic cell, wherein the first lamina of semiconductor material comprises at least a portion of the base or of the emitter, or both, of the photovoltaic cell.

An embodiment of the invention provides for a method for fabricating a photovoltaic cell, the method comprising: doping at least portions of a first surface of a semiconductor wafer; implanting hydrogen ions through the first surface; affixing the first surface to a receiver; and after the affixing step, cleaving a first semiconductor lamina from the semiconductor wafer, wherein the first lamina comprises the first surface, wherein the first surface is bonded to the receiver, wherein current is generated within the first lamina when it is exposed to light.

Another embodiment of the invention provides for a method for making a photovoltaic module, the method comprising: affixing a plurality of semiconductor wafers to a receiver; and after the affixing step, cleaving a semiconductor lamina from each of the semiconductor wafers, wherein each lamina is bonded to the receiver, wherein the photovoltaic module comprises the receiver and the laminae.

Still another aspect of the invention provides for a semiconductor lamina comprising a photovoltaic cell, the semiconductor lamina having substantially parallel first and second surfaces, wherein a thickness between the first and second surfaces is between about 0.2 and about 100 microns, wherein wiring contacts the first surface but no wiring contacts the second surface, and wherein incident light enters the photovoltaic cell through the second surface.

Another embodiment of the invention provides for a semiconductor lamina comprising a photovoltaic cell, the semiconductor lamina having substantially parallel first and second surfaces, wherein a thickness between the first and second surfaces is between about 0.2 and about 100 microns, wherein wiring contacts the first surface but no wiring contacts the second surface, and wherein incident light enters the photovoltaic cell through the second surface.

Still another embodiment of the invention provides for a lamina of semiconductor material, the lamina of semiconductor material having substantially parallel first and second surfaces, wherein the distance between the first and second surfaces is between about 1 micron and about 100 microns, wherein peak-to-valley surface roughness of the first surface or the second surface is greater than about 600 angstroms, and wherein the lamina comprises a photovoltaic cell or a portion of a photovoltaic cell.

An embodiment of the invention provides for a photovoltaic module comprising: a receiver; and a plurality of semiconductor laminae bonded to the receiver, wherein each semiconductor lamina is between about 1 and about 100 microns thick, wherein each semiconductor lamina comprises at least a portion of a base, or of an emitter, of a photovoltaic cell. A related embodiment provides for a photovoltaic module comprising: a plurality of laminae, each lamina having a thickness between about 0.2 and about 100 microns, each lamina comprising at least a portion of a base or of an emitter of a photovoltaic cell; and a substrate, wherein each lamina is bonded to the substrate. Still another related embodiment provides for a photovoltaic module comprising: a plurality of laminae, each lamina having a thickness between about 0.2 and about 100 microns, each lamina comprising at least a portion of a base or of an emitter of a photovoltaic cell; and a superstrate, wherein each lamina is bonded to the superstrate.

Another aspect of the invention provides for a method for forming a device, the method comprising: adhering a first surface of a semiconductor body to a receiver, wherein the receiver is metal or polymer; and cleaving a lamina from the semiconductor body, wherein the lamina comprises the first surface, the first surface remains adhered to the receiver, and the lamina is between 1 and 80 microns thick.

Another aspect of the invention provides for a method for forming multiple laminae, the method comprising: cleaving a first lamina from a semiconductor wafer, wherein the semiconductor wafer has a first thickness less than about 1000 microns and the first lamina has a thickness of about 1 micron or more; and after cleaving the first lamina, cleaving a second lamina from the semiconductor wafer, wherein the second lamina has a thickness of about one micron or more, wherein, after cleaving the second lamina, the semiconductor wafer has a second thickness greater than about 180 microns, and wherein the difference between the second thickness and the first thickness is at least the combined thickness of the first lamina and the second lamina.

Still another embodiment of the invention provides for a photovoltaic cell comprising: a lamina having a thickness between about 0.2 micron and about 100 microns, the lamina comprising at least a portion of a base of the photovoltaic cell, wherein the lamina comprises monocrystalline, multicrystalline, or polycrystalline semiconductor material; and a first amorphous semiconductor layer comprising at least a portion of an emitter of the photovoltaic cell.

Another embodiment of the invention provides for a photovoltaic device comprising: a semiconductor lamina having a thickness between about 1 micron and about 20 microns, wherein the lamina has a first surface and a second surface substantially parallel to the first surface, wherein the lamina comprises at least a portion of a base of a photovoltaic cell, wherein electrical contact is made to both the first surface and the second surface of the photovoltaic cell; and a substrate or superstrate, wherein the lamina is affixed to the substrate or superstrate at the first surface or the second surface.

Another embodiment of the invention provides for a method for forming a photovoltaic cell, the method comprising: depositing a first layer of a first material on a first surface of a silicon wafer; implanting one or more species of gas ions through the first surface to define a cleave plane; affixing the wafer to a receiver at the first surface; heating the wafer to exfoliate a lamina from the wafer along a cleave plane, wherein the lamina comprises the first surface and the lamina remains affixed to the receiver; texturing the first surface or the second surface of the lamina.

Still another embodiment provides for a photovoltaic cell comprising: a crystalline silicon lamina having thickness between about 1 micron and about 20 microns, wherein the lamina comprises a base and an emitter of the photovoltaic cell, the lamina having a first surface, and a second surface substantially parallel to the first surface; a substrate, wherein the lamina is affixed to the substrate at the first surface; a metal layer between the lamina and the substrate; and wiring in electrical contact with the second surface, wherein incident light enters the photovoltaic cell at the second surface.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

A typical silicon wafer used to make a photovoltaic cell is about 200 to 250 microns thick. It is known to slice silicon wafers as thin as about 180 microns, but such wafers are fragile and prone to breakage.

Figure 1:
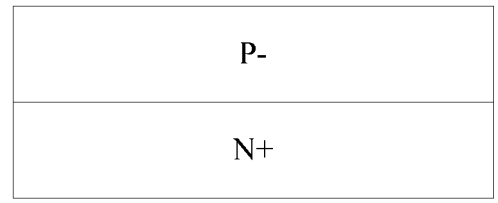
FIG. 1 is a cross-sectional view depicting a prior art photovoltaic cell.

A conventional prior art photovoltaic cell includes a p-n diode; an example is shown in FIG. 1. A depletion zone forms at the p-n junction, creating an electric field. Incident photons will knock electrons from the conduction band to the valence band, creating electron-hole pairs. Within the electric field at the p-n junction, electrons tend to migrate toward the n region of the diode, while holes migrate toward the p region, resulting in current. This current can be called the photocurrent. Typically the dopant concentration of one region will be higher than that of the other, so the junction is either a p−/n+ junction (as shown in FIG. 1) or a p+/n− junction. The more lightly doped region is known as the base of the photovoltaic cell, while the more heavily doped region is known as the emitter. Most carriers are generated within the base, and it is typically the thickest portion of the cell. The base and emitter together form the active region of the cell.

Within certain ranges, conversion efficiency of a photovoltaic cell varies with its thickness. In this discussion, conversion efficiency refers to the fraction of incident photon current that is converted to usable electrical current. As the thickness of a cell is reduced, more light will pass through it without being absorbed. Additional thickness allows for more absorption and higher cell efficiency. Light absorption can also be improved by increasing the distance light travels through the cell by bending it at an oblique angle or by internally reflecting it multiple times through the cell. Bending can be caused, for example, by texturing one or both surfaces of the cell, and reflection by coating one surface with a reflective material. These effects are known as light trapping.

A surface that is textured such that the angles of transmitted and reflected light are fully randomized is called a Lambertian surface. That is, for a Lambertian surface, the photon flux density per unit solid angle is independent of the direction of the incident light and position along the surface.

Figure 2:
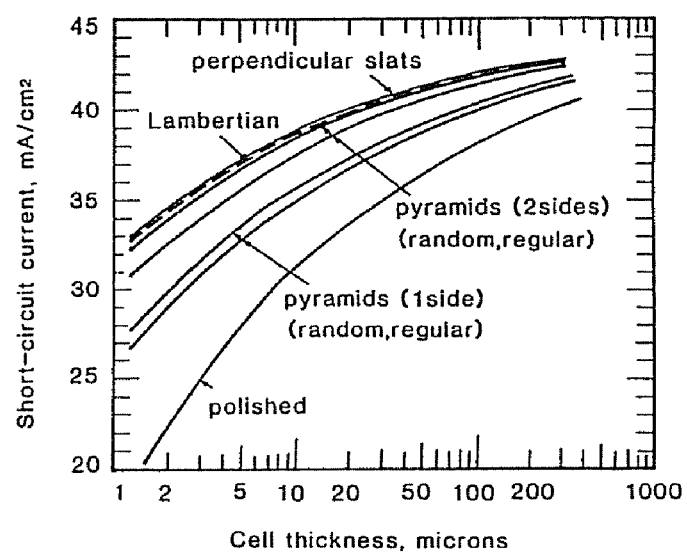
FIG. 2 is a graph of short-circuit current vs thickness of various silicon photovoltaic cells.

As noted, photovoltaic cells are generally at least 200 microns thick, but need not be. FIG. 2 is a graph showing theoretical short-circuit current density ($J_{SC}$) vs. thickness for various photovoltaic cells. (FIG. 2 is taken from Green, M. A., (1995) "Silicon Solar Cells, Advanced Principles and Practice," Centre for Photovoltaic Devices and Systems, University of New South Wales.) It will be seen that for a cell having Lambertian surfaces, $J_{SC}$ decreases with decreasing thickness, but relatively gradually. For example, for the curve labeled "Lambertian" in FIG. 2, at about 100 microns, $J_{SC}$ is about 42 mA/cm$^2$, while at 50 microns, $J_{SC}$ has dropped only slightly, to about 41 mA/cm$^2$; at 10 microns, $J_{SC}$ is still well above 35 mA/cm$^2$. Substantially thinner photovoltaic cells, at 5, 2, 1, and even a fraction of a micron thick, can theoretically be made with commercially useful efficiencies, if they can be made at sufficiently low cost.

In embodiments of the present invention, a very thin semiconductor lamina is cleaved from a semiconductor donor body, for example a monocrystalline or multicrystalline silicon wafer, by means other than conventional slicing, allowing the lamina to be much thinner. The lamina can be processed to form all or a portion of a photovoltaic cell.

Figure 3A:
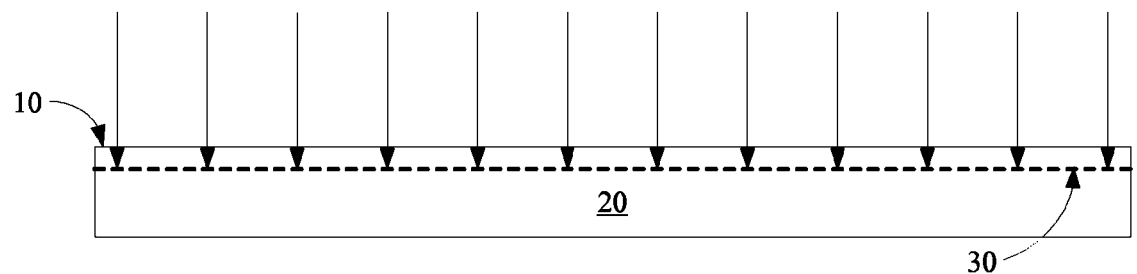
FIGS. 3a and 3b are cross-sectional views showing stages in formation of a photovoltaic cell according to an embodiment of the present invention.

Referring to FIG. 3a, in a preferred embodiment, one or more species of gas ions are implanted through a first surface 10 of a wafer 20. The ions are slowed by electronic interactions and by nuclear collisions with atoms in the lattice. The implanted ions reach a distribution of depths, some deeper, some shallower. This distribution will have a maximum concentration at some depth below first surface 10. The implant process results in lattice damage, also at a distribution of depths. The damage consists of vacant lattice sites created by displacement of the lattice atoms due to collisions with the incoming implanted atoms. This damage also has a depth of maximum concentration, which is slightly shallower than the depth of the maximum concentration of implanted gas atoms. The implant defines a cleave plane 30 along which a lamina can be cleaved from the wafer 20. The depth of cleave plane 30 can be between about 0.2 micron and about 100 microns.

Figure 3B:
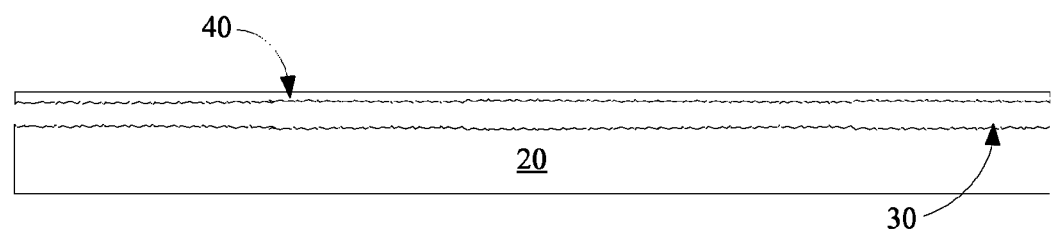

As shown in FIG. 3b, when the wafer is heated, the implanted gas ions migrate to cleave plane 30, forming bubbles or micro-cracks. The bubbles or micro-cracks expand and merge, resulting in separation of lamina 40 from donor wafer 20.

Figure 4A:
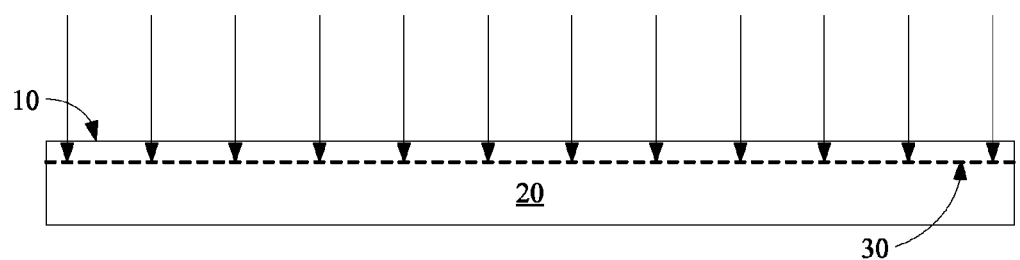
FIGS. 4a through 4d are cross-sectional views showing stages in formation of a photovoltaic cell according to an embodiment of the present invention.
Figure 4B:
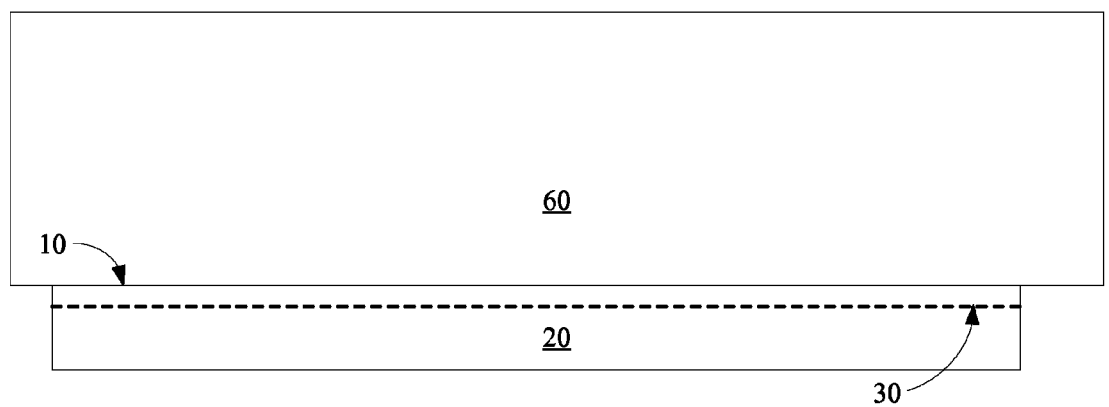
Figure 4C:
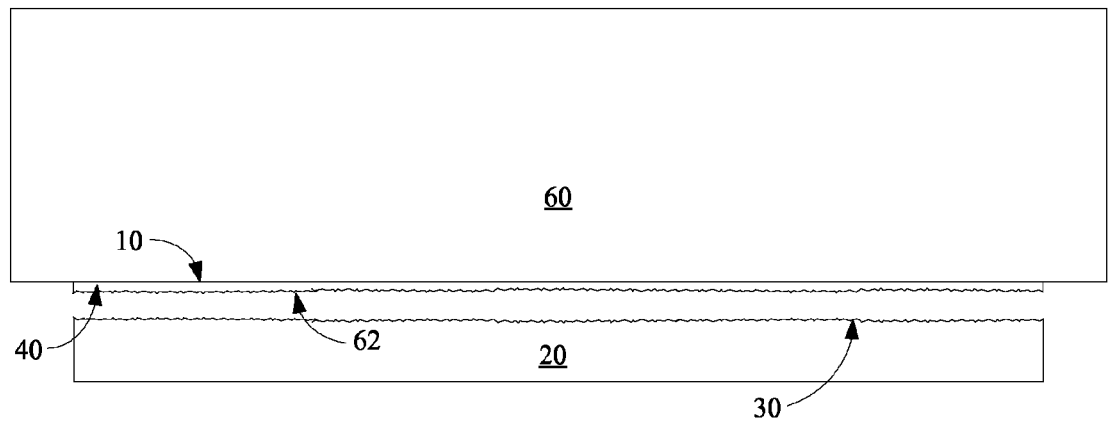

The much thinner lamina of the present invention is necessarily more fragile than a relatively thick wafer, and must be handled carefully to avoid breakage. Thus in some embodiments, as shown in FIG. 4a, first surface 10 of wafer 20 is processed first, including, for example, doping with p-type and/or n-type dopants, texturing to increase light trapping, growth or deposition of films, etc. After doping, gas ions are implanted through first surface 10, defining subsurface cleave plane 30. Turning to FIG. 4b, following definition of cleave plane 30, first surface 10 is affixed or adhered to a planar surface 60, which will be referred to as a receiver. As shown in FIG. 4c, a subsequent thermal anneal causes lamina 40 to exfoliate along previously defined cleave plane 30; this anneal may also serve to complete bonding of lamina 40 to receiver 60.

Cleaving creates second surface 62. Additional processing, such as surface texturing, formation of an antireflective layer, doping, formation of wiring, etc., may be performed to second surface 62. Depending on the embodiment, receiver 60 can serve as either a substrate or a superstrate in the finished device, which may be a photovoltaic module. In still other embodiments, lamina 40 may be temporarily transferred to receiver 60, then transferred to some other substrate or superstrate. In some embodiments, electrical contact to lamina 40 is made only at first surface 10 or at second surface 62, while in other embodiments, electrical contact is made at both first surface 10 and second surface 62.

The result is a lamina 40 having thickness between about 0.2 and about 100 microns, preferably between about 1 and about 10 microns; in some embodiments this thickness is between about 1 and about 5 microns. Lamina 40 comprises or is a portion of a solar cell. Lamina 40 has been processed on both sides and is affixed to a substrate or superstrate. A solar panel or photovoltaic module can be fabricated by affixing a plurality of laminae to the same substrate or superstrate. The plurality of laminae can be formed in the same steps, further reducing cost.

It should be noted that in the process just described, a contiguous, monolithic semiconductor donor body having a first thickness is provided. A different process is known in the art by which an epitaxially grown layer of crystalline silicon is first formed on, then separated from a porous silicon layer. In one example, a silicon wafer may be subjected to anodic etching, which forms a series of voids at or near the wafer surface. The voids typically have dimensions of a micron or more. An anneal in hydrogen reconstructs a top surface of silicon having a separation layer of voids below it. Silicon is epitaxially grown on this reconstructed silicon layer by depositing silicon in a separate step on a single crystal substrate. The epitaxially grown layer is then separated from the original wafer at the separation layer. The material making up the separated layer was grown, and is not a portion of the original wafer; thus the thickness of the wafer is not reduced by the thickness of the detached layer, only by the thickness of the separation layer consisting of voids formed by anodic etching. Immediately before the splitting step, the semiconductor wafer has a layer on it which is epitaxially grown, and includes voids; it is not a contiguous, monolithic donor body.

In contrast, in the present invention, a contiguous, monolithic semiconductor donor body is provided. In general, the donor body has no voids. The cleaved lamina is a portion of the contiguous, monolithic semiconductor donor body, not a separate layer which is epitaxially grown on the body by depositing silicon in a separate step on a single crystal substrate. Thus cleaving the lamina from the donor body reduces the thickness of the original donor body by at least the thickness of the lamina.

Example

Implant and Exfoliation

An effective way to cleave a thin lamina from a semiconductor donor body is by implanting gas ions into the semiconductor donor body to define a cleave plane, then to exfoliate the lamina along the cleave plane. For completeness, a detailed example will be provided of how to perform implant and exfoliation. Note exfoliation is one form of cleaving. It will be understood that this example is provided for illustration only, and is not intended to be limiting. Many details of this example can be altered, omitted, or augmented while the result falls within the scope of the invention.

This description will detail implant into a monocrystalline silicon wafer. It will be understood that many other types of semiconductor donor bodies may be used instead. Referring to FIG. 4a, one or more species of ions is implanted (indicated by arrows) through first surface 10 of wafer 20. A variety of gas ions may be used, including hydrogen (H+, $H_2$+) and helium (He+, He++). In some embodiments, hydrogen ions alone, or helium ions alone, may be implanted; in alternative embodiments, hydrogen ions or helium ions are implanted together. Each implanted ion will travel some depth below first surface 10. It will be slowed by electronic interactions and nuclear collisions with atoms as it travels through the lattice. The nuclear collisions may lead to displacement of the lattice atoms creating vacancies or vacant lattice sites, which are effectively damage to the lattice.

Some ions will travel farther than others, and after implant, there will be a distribution of ion depths. Similarly, lattice damage is caused at a distribution of depths, this damage distribution lagging slightly behind the ion distribution. There will be a maximum concentration in each distribution. If hydrogen is implanted, the maximum concentration of damage, which is slightly shallower than the maximum concentration of hydrogen ions, will generally be the cleave plane. If the implant includes helium, or some other gas ion, but does not include hydrogen, the maximum concentration of implanted ions will be the cleave plane. In either case, the ion implantation step defines the cleave plane, and implant energy defines the depth of the cleave plane. It will be understood that this cleave plane cannot be a perfect plane, and will have some irregularities. If both hydrogen and helium ions are implanted, it is preferred for their maximum concentration to occur substantially at or near the same depth, though they may not be exactly the same. It is preferred, though not required, that the hydrogen implant is performed before the helium implant.

In other embodiments, other gas ions may be implanted, including neon, crypton, argon, etc., either alone or in combination with helium, with hydrogen, or with hydrogen and helium; or indeed in any combination. These ions have larger mass, so higher implant energies are required to implant them to the same depth as a smaller mass ion.

If hydrogen has been implanted, hydrogen atoms passivate dangling silicon bonds by forming Si—H bonds. Atomic hydrogen will readily passivate the broken silicon bonds present at vacant lattice sites. In some cases, multiple hydrogen atoms will bond to adjacent silicon atoms forming a platelet defect. Platelet defects are more fully described by Johnson et al., "Defects in single-crystal silicon induced by hydrogenation," Phys. Rev. B 35, pp. 4166-4169 (1987), hereby incorporated by reference. Some hydrogen atoms will not bond with silicon, and will remain free in the lattice as either atomic or molecular hydrogen. Implanted helium atoms are inert and will not form bonds, and will thus remain free in the lattice.

As shown in FIG. 4a, the ion implantation step defines cleave plane 30 for a subsequent cleaving step. The depth of cleave plane 30 from first surface 10 in turn will determine the thickness of the lamina ultimately to be produced. As described earlier, this thickness affects the conversion efficiency of the completed cell. In some embodiments, one or more thin films may have been deposited or grown on first surface 10 before implantation.

The depth of the implanted ions is determined by the energy at which the gas ions are implanted. At higher implant energies, ions travel farther, increasing the depth of the maximum concentration of implanted ions, and the maximum concentration of damage, and thus the depth of the cleave plane. The depth of the cleave plane in turn determines the thickness of the lamina.

Preferred thicknesses for the lamina are between about 0.2 and about 100 microns; thus preferred implant energies for H+ range from between about 20 keV and about 10 MeV. Preferred implant energies for He+ ions to achieve these depths also range between about 20 keV and about 10 MeV.

During implant, collisions may occur between the ions being implanted and atoms in the ion implanter, At certain known energies, these collisions can cause nuclear reactions, creating gamma radiation, alpha particles, or x-rays. Depending on ion dose rate and shielding, it may be preferred to avoid the energies that will cause such reactions. The amount of radiation and its acceptability are however a function of ion dose rate and shielding. The topic is more fully discussed by Saadatmand et al., "Radiation Emission from Ion Implanters when Implanting Hydrogen and Deuterium," Proceedings of the 1998 International Conference on Ion Implantation Technology, pp. 292-295, 1999.

In a typical ion implanter, ions are generated in the ion source by creating a plasma of some convenient source gas or solid. These ions are subsequently extracted from the source and mass analyzed to select only the desired ion species. There may be ions present in the plasma which are rejected by the mass analysis. In an alternative type of implanter there is no mass analysis and hence all of the ion species present in the source plasma are implanted into the wafer target. In the case of a hydrogen plasma, both H+ and $H_2$+ ions will likely be present. If the ions are not subject to mass analysis, both H+ and $H_2$+ will be implanted, creating two distribution peaks at different depths. This is less preferred, as it may render the subsequent exfoliation step more difficult to control. If hydrogen is implanted without mass analysis, it is advantageous to operate the source in a fashion that will produce a preponderance of either H+ ions or $H_2$+ ions.

As described, an implant leaves implanted ions at a variety of depths. A higher energy implant leaves more ions at depths shallower and deeper than the depth of the maximum concentration than does a lower energy implant, resulting in a broader distribution of implanted atoms. The cleaving process proceeds by diffusion of the gas atoms to the cleave plane; this broader distribution means that a higher implant dose is required for a higher energy implant.

As described by Agarval et al. in "Efficient production of silicon-on-insulator films by co-implantation of He+ with H+", American Institute of Physics, vol. 72, num. 9, pp. 1086-1088, March 1998, hereby incorporated by reference, it has been found that by implanting both H+ and He+ ions, the required dose for each can be significantly reduced. Decreasing dose decreases time and energy spent on implant, and may significantly reduce processing cost.

In some embodiments, it may be preferred to additionally implant a small dose of boron ions, preferably at a depth substantially coinciding with the target depth of hydrogen and helium ions. Boron causes hydrogen to diffuse faster, reducing the temperature at which the eventual exfoliation of the lamina can be performed. This effect is described in detail by Tong, U.S. Pat. No. 6,563,133, "Method of epitaxial-like wafer bonding at low temperature and bonded structure."

For clarity, examples of implant dose and energy will be provided. To form a lamina having a thickness of about 1 micron, implant energy for hydrogen should be about 100 keV; for a lamina of about 2 microns, about 200 keV, for a lamina of about 5 microns, about 500 keV, and for a lamina of about 10 microns, about 1000 keV. If hydrogen alone is implanted, the dose for a lamina of about 1 or about 2 microns will range between about $0.4 \times 10^{17}$ and about $1.0 \times 10^{17}$ ions/$cm^2$, while the dose for a lamina of about 5 or about 10 microns will range between about $0.4 \times 10^{17}$ and about $2.0 \times 10^{17}$ ions/$cm^2$.

If hydrogen and helium are implanted together, the dose for each is reduced compared to when either is implanted separately. When implanted with helium, hydrogen dose to form a lamina of about 1 or about 2 microns will be between about $0.1\times10^{17}$ and about $0.3\times10^{17}$ ions/cm$^2$, while to form a lamina of about 5 or about 10 microns hydrogen dose may be between about $0.1\times10^{17}$ and about $0.5\times10^{17}$ ions/cm$^2$.

When hydrogen and helium are implanted together, to form a lamina having a thickness of about 1 micron, implant energy for helium should be about 50 to about 200 keV; for a lamina of about 2 microns, about 100 to about 400 keV; for a lamina of about 5 microns, about 250 to about 1000 keV; and for a lamina of about 10 microns, about 500 keV to about 1000 keV. When implanted with hydrogen, helium dose to form a lamina of about 1 or about 2 microns may be about $0.1\times10^{17}$ to about $0.3\times10^{17}$ ions/cm$^2$, while to form a lamina of about 5 or about 10 microns, helium dose may be between about $0.1\times10^{17}$ and about $0.5\times10^{17}$ ions/cm$^2$.

It will be understood that these are examples. Energies and doses may vary, and intermediate energies may be selected to form laminae of intermediate, lesser, or greater thicknesses.

Once ion implantation has been completed, further processing may be performed on wafer 20. Elevated temperature will induce exfoliation at cleave plane 30; thus until exfoliation is intended to take place, care should be taken, for example by limiting temperature and duration of thermal steps, to avoid inducing exfoliation prematurely. Once processing to first surface 10 has been completed, as shown in FIG. 4b, wafer 20 can be affixed to receiver 60.

Turning to FIG. 4c, exfoliation of a lamina 40 is most readily effected by increasing temperature. As described above, the earlier implant step left a distribution of gas ions, and a distribution of lattice damage in the donor silicon wafer, where the implant defined cleave plane 30. If hydrogen was implanted, many hydrogen ions broke silicon bonds during collisions with silicon atoms and passivated those bonds, in some cases forming platelet defects, as described earlier. These platelet defects are on the order of 30 to 100 angstroms wide, less than 200 angstroms wide, at room temperature. After implant and before cleaving, the wafer is a contiguous, monolithic semiconductor donor body having no voids larger than the platelet defects. Receiver 60 with affixed wafer 20 is subjected to elevated temperature, for example between about 200 and about 800 degrees C. Exfoliation proceeds more quickly at higher temperature. In some embodiments, the temperature step to induce exfoliation is performed at between about 200 and about 500 degrees C., with anneal time on the order of hours at 200 degrees C., and on the order of seconds at 500 degrees C. As temperature increases, the platelet defects begin to expand as more and more of the unbonded gas atoms diffuse in all directions, some collecting in the platelet defects, and forming micro-cracks. Eventually the micro-cracks merge and the pressure exerted by the expanding gas causes lamina 40 to separate entirely from the donor silicon wafer 20 along cleave plane 30. The presence of receiver 60 forces the micro-cracks to expand sideways, forming a continuous split along cleave plane 30, rather than expanding perpendicularly to cleave plane 30 prematurely, which would lead to blistering and faking at first surface 10.

Note that platelet defects will only form when hydrogen is implanted. If helium or other gas ions are implanted without hydrogen, the implanted atoms will form micro-cracks or bubbles that fill up with gas, then cleave along cleave plane 30.

It will be apparent that relative dimensions, for example thicknesses of receiver 60, wafer 20, and lamina 40, cannot practically be shown to scale in figures.

It was mentioned previously that coimplanting boron with hydrogen will cause hydrogen to diffuse faster. For this reason, it is expected that if wafer 20 is p-doped with boron, a common p-type dopant, exfoliation may be achieved at a slightly lower temperature than if it is intrinsic or lightly n-doped.

In alternative embodiments, other methods, or a combination of methods, may be used to induce exfoliation of lamina 40. For example, methods described by Henley et al., U.S. Pat. No. 6,528,391, "Controlled cleavage process and device for patterned films," hereby incorporated by reference, may be employed.

Figure 4D:
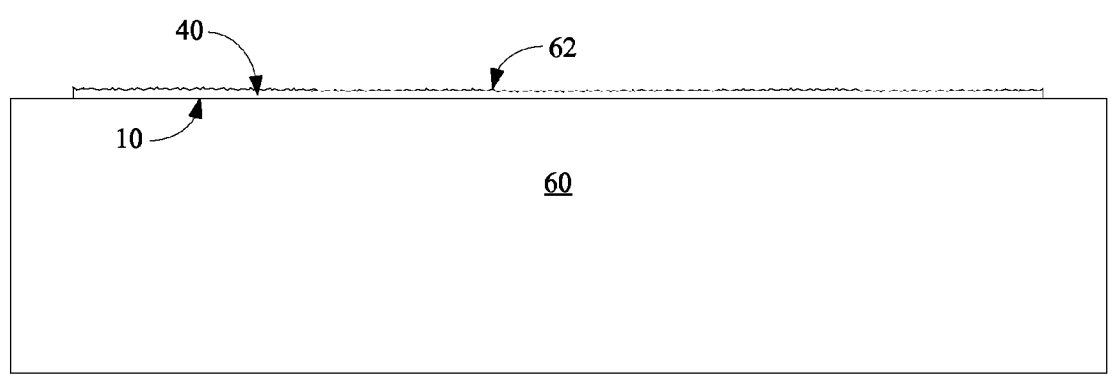

FIG. 4d shows the structure inverted, with receiver 60 on the bottom. It will be seen that lamina 40 is created by the cleaving step, and that lamina 40 comprises first surface 10, and has a second surface 62 substantially parallel to first surface 10. As will be described, lamina 40 comprises or is, or will be, a portion of a photovoltaic cell. First surface 10 remains affixed to receiver 60. In some embodiments the elevated temperature used to perform the exfoliation will also serve to simultaneously complete the bonding process between first surface 10 and receiver 60.

It is known to form silicon-on-insulator films for use in the semiconductor industry by implanting gas ions into a silicon wafer, bonding the silicon wafer to an oxide wafer, and exfoliating a thin skin of silicon onto the oxide wafer. Semiconductor devices, such as transistors are then fabricated in the exfoliated silicon skin.

The technique of gas ion implantation into a semiconductor wafer and exfoliation of a thin silicon skin has not been used to form photovoltaic cells, however, despite the fact that material cost is a large fraction of the cost of most commercial solar cells, and solar manufacturers face a worldwide silicon shortage. As noted earlier, conventional wafering techniques are hugely wasteful of silicon.

Ion implantation is widely used in fabrication of semiconductor devices, but has been considered impractical for widespread use in the solar industry, as keeping processing cost low is generally paramount for solar manufacturers.

Typical high-dose implants used in the semiconductor industry are in the range of $1\times10^{14}$ to $3\times10^{15}$ ions/cm$^2$ at energies up to about 80 keV. Exfoliating a lamina having a thickness of 1-10 microns, for example, requires implant energy of hundreds of keV, and at relatively high doses, for example $4\times10^{16}$ to $2\times10^{17}$ ions/cm$^2$. Higher implant dose at higher energy increase the cost of the implant.

The inventors of the present invention have recognized that a lamina of 100 microns or less, for example 10 microns or less, can be used to form a photovoltaic cell with acceptable conversion efficiency, even where the lamina comprises all or portions of the base and/or emitter, the active regions of the cell. The implantation of gas ions in the embodiments described herein can be performed today on existing implanters. The inventors believe that use of a specialized, high-throughput implanter would substantially reduce the cost of this implant.

For clarity, several examples of fabrication of a lamina having thickness between 0.2 and 100 microns, where the lamina comprises, or is a portion of, a photovoltaic cell according to embodiments of the present invention, will be provided. For completeness, many materials, conditions, and steps will be described. It will be understood, however, that many of these details can be modified, augmented, or omitted while the results fall within the scope of the invention. In these embodiments, it is described to cleave a semiconductor lamina by implanting gas ions and exfoliating the lamina.

Other methods of cleaving a lamina from a semiconductor wafer could also be employed in these embodiments.

Example

Standard Front-and-Back Contact Cell

The process begins with a donor body 20 of an appropriate semiconductor material. An appropriate donor body may be a monocrystalline silicon wafer of any practical thickness, for example from about 300 to about 1000 microns thick. In alternative embodiments, the wafer may be thicker; maximum thickness is limited only by practicalities of wafer handling. Alternatively, polycrystalline or multicrystalline silicon may be used, as may microcrystalline silicon, or wafers or ingots of other semiconductors materials, including germanium, silicon germanium, or III-V or II-VI semiconductor compounds such as GaAs, InP, etc. In this context the term multicrystalline typically refers to semiconductor material having crystals that are on the order of a millimeter in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline.

The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge on a photovoltaic module with no unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 5A:
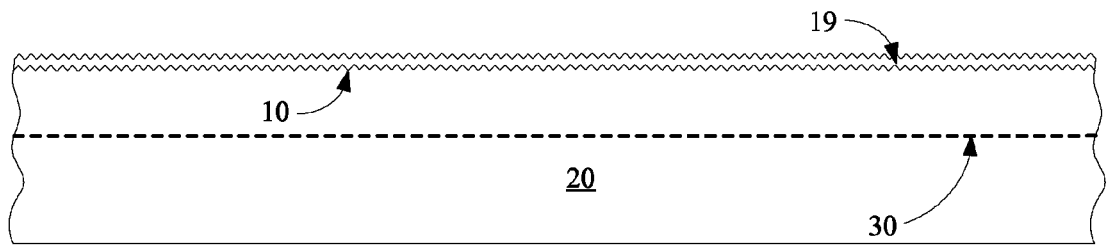
FIGS. 5a-5c are cross-sectional views showing stages in formation of a photovoltaic cell according to an embodiment of the present invention.

Referring to FIG. 5a, wafer 20 is formed of monocrystalline silicon which is preferably lightly doped to a first conductivity type. The present example will describe a relatively lightly p-doped wafer 20 but it will be understood that in this and other embodiments the dopant types can be reversed. Dopant concentration may be between about $1 \times 10^{14}$ and $1 \times 10^{18}$ atoms/cm$^3$; for example between about $3 \times 10^{14}$ and $1 \times 10^{15}$ atoms/cm$^3$; for example about $5 \times 10^{14}$ atoms/cm$^3$. Desirable resistivity for p-type silicon may be, for example, between about 133 and about 0.04 ohm-cm, preferably about 44 to about 13.5 ohm-cm, for example about 27 ohm-cm. For n-type silicon, desirable resistivity may be between about 44 and about 0.02 ohm-cm, preferably between about 15 and about 4.6 ohm-cm, for example about 9 ohm-cm.

First surface 10 is optionally treated to produce surface roughness, for example, to produce a Lambertian surface. The ultimate thickness of the lamina limits the achievable roughness. In conventional silicon wafers for photovoltaic cells, surface roughness, measured peak-to-valley, is on the order of a micron. In embodiments of the present invention, the thickness of the lamina may be between about 0.2 and about 100 microns. Preferred thicknesses include between about 1 and about 80 microns; for example, between about 1 and about 20 microns or between about 2 and about 20 microns. Practically, any thickness in the range between about 0.2 and about 100 microns is achievable; advantageous thicknesses may be between about 1 and about 1.5, 2, 3, 5, 8, 10, 20, or 50 microns.

If the final thickness is about 2 microns, clearly surface roughness cannot be on the order of microns. For all thicknesses, a lower limit of surface roughness would be about 500 angstroms. An upper limit would be about a quarter of the film thickness. For a lamina 1 micron thick, surface roughness may be between about 600 angstroms and about 2500 angstroms. For a lamina having a thickness of about 10 microns, surface roughness will be less than about 25000 angstroms, for example between about 600 angstroms and 25000 angstroms. For a lamina having a thickness of about 20 microns, surface roughness may be between about 600 angstroms and 50000 angstroms.

This surface roughness can be produced in a variety of ways which are well-known in the art. For example, a wet etch such as a KOH etch selectively attacks certain planes of the silicon crystal faster than others, producing a series of pyramids on a (100) oriented wafer, where the (111) planes are preferentially etched faster. A non-isotropic dry etch may be used to produce texture as well. Any other known methods may be used. The resulting texture is depicted in FIG. 5a. Surface roughness may be random or may be periodic, as described in "Niggeman et al., "Trapping Light in Organic Plastic Solar Cells with Integrated Diffraction Gratings," Proceedings of the 17$^{th}$ European Photovoltaic Solar Energy Conference, Munich, Germany, 2001.

In some embodiments, diffusion doping may be performed at first surface 10. First surface 10 will be more heavily doped in the same conductivity type as original wafer 20, in this instance p-doped. Doping may be performed with any conventional p-type donor gas, for example $B_2H_6$ or $BCl_3$. In other embodiments, this diffusion doping step can be omitted.

Next ions, preferably hydrogen or a combination of hydrogen and helium, are implanted to define a cleave plane 30, as described earlier. Before implant, it may be preferred to form a thin oxide layer 19, which may be about 100 angstroms or less on first surface 10. Oxide layer 19 may serve to reduce surface damage during the implant. This oxide, generally silicon dioxide, can be formed by any conventional method. If diffusion doping is performed before the implant, providing some oxygen during diffusion doping will cause silicon dioxide layer 19 to grow.

Note that the plane of maximum distribution of implanted ions, and of implant damage, is conformal. Any irregularities at first surface 10 will be reproduced in cleave plane 30. Thus in some embodiments it may be preferred to roughen surface 10 after the implant step rather than before.

Figure 5B:
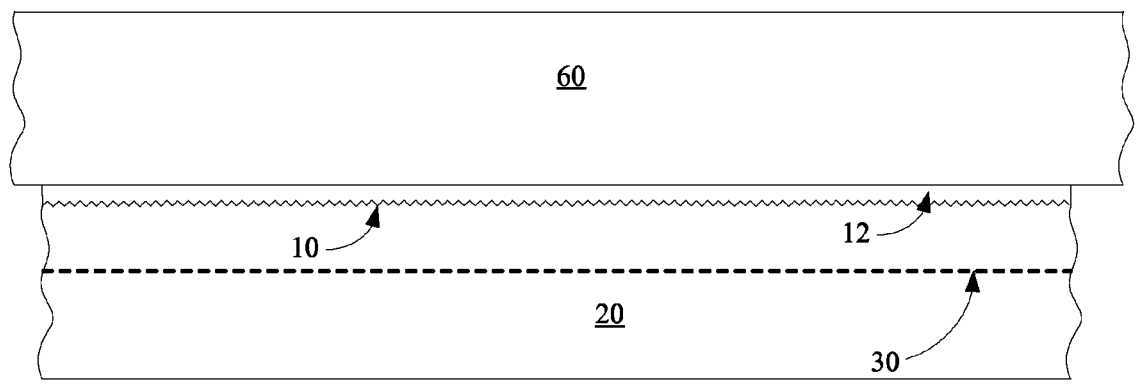

After implant, oxide layer 19 is removed and first surface 10 is cleaned. Once the implant has been performed, exfoliation will occur once certain conditions, for example elevated temperature, are encountered. It is necessary, then, to keep processing temperature and duration below those which will initiate exfoliation until exfoliation is intended to take place. In general, exfoliation is more readily controlled, and the lamina is more easily handled, if the first surface 10, through which the implant was performed, is affixed to a receiver of some sort to provide mechanical support. In preferred embodiments, to minimize handling, this receiver is in fact a superstrate or substrate which will be part of the photovoltaic module after fabrication is complete. This receiver may be any appropriate material, such as semiconductor, glass, metal, or polymer. Referring to FIG. 5b, in the present example, the receiver to which first surface 10 is affixed is a substrate 60. In the present embodiment, substrate 60 may be borosilicate glass or some other material that can tolerate relatively high temperature.

A reflective metallic material, for example titanium or aluminum, should contact first surface 10. Other alternatives for such a layer, in this and other embodiments, include chromium, molybdenum, tantalum, zirconium, vanadium, or tungsten. In some embodiments, it may be preferred to deposit a thin layer 12 of aluminum onto first surface 10. For example, aluminum can be sputter deposited onto first surface 10. Alternatively, the surface of substrate 60 may be coated with aluminum or some other reflective metallic material. Subsequent thermal steps will soften the aluminum, causing it to flow and make good contact with first surface 10. In other embodiments, an aluminum layer can be formed on both first surface 10 and on substrate 60.

Figure 5C:
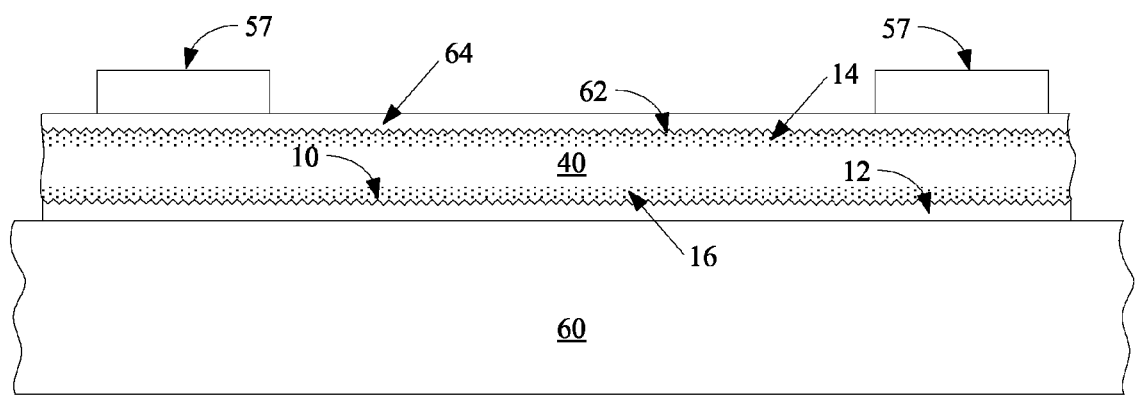

Turning to FIG. 5*c*, lamina 40 can now be cleaved from donor wafer 20 at cleave plane 30 as described earlier. Second surface 62 has been created by exfoliation. In FIG. 5*c*, the structure is shown inverted, with substrate 60 on the bottom. As has been described, some surface roughness is desirable to increase light trapping within lamina 40 and improve conversion efficiency of the photovoltaic cell. The exfoliation process itself creates some surface roughness at second surface 62. In some embodiments, this roughness may alone be sufficient. In other embodiments, surface roughness of second surface 62 may be modified or increased by some other known process, such as a wet or dry etch, as may have been used to roughen first surface 10. If metal 12 is a p-type acceptor such as aluminum, annealing at this point or later may serve to form or additionally dope p-doped region 16 by causing metal atoms from metal layer 12 to diffuse into region 16.

Next a region 14 at the top of lamina 40 is doped through second surface 62 to a conductivity type opposite the conductivity type of the original wafer 20. In this example, original wafer 20 was lightly p-doped, so doped region 14 will be n-type. This doping may be performed by any conventional means. In preferred embodiments this doping step is performed by diffusion doping using any appropriate donor gas that will provide an n-type dopant, for example $POCl_3$.

Diffusion doping is typically performed at relatively high temperature, for example between about 700 and about 900 degrees C., although lower temperature methods, such as plasma enhanced diffusion doping, can be performed instead. This elevated temperature will cause some aluminum from aluminum layer 12 to diffuse in at first surface 10. This elevated temperature can serve as the anneal mentioned earlier to form a more heavily doped p-type region 16 which will serve to form a good electrical contact to aluminum layer 12. If doping of p-region 16 from aluminum layer 12 is sufficient, the earlier diffusion doping step performed at first surface 10 to form this region can be omitted. If oxygen is present during the n-type diffusion doping step, a thin layer of silicon dioxide (not shown) will form at second surface 62.

Antireflective layer 64 is preferably formed, for example by deposition or growth, on second surface 62. Incident light enters lamina 40 through second surface 62; thus this layer should be transparent. In some embodiments antireflective layer 64 is silicon nitride, which has a refractive index of about 1.5 to 3.0; its thickness would be, for example, between about 500 and 2000 angstroms, for example about 650 angstroms.

Next wiring 57 is formed on layer 64. In some embodiments, this wiring is formed by screen printing conductive paste in the pattern of wiring, which is then fired at high temperature, for example between about 700 and about 900 degrees C. For example, if layer 64 is silicon nitride, it is known to screen print wiring using screen print paste containing silver. During firing, some of the silver diffuses through the silicon nitride, effectively forming a via through the insulating silicon nitride 64, making electrical contact to n-doped silicon region 14. Contact can be made to the silver remaining above antireflective layer 64.

FIG. 5*c* shows a completed photovoltaic cell according to one embodiment of the present invention. Lamina 40 is bonded to substrate 60 at first surface 10. Incident light enters lamina 40 at second surface 62. Note that the lightly p-doped body of lamina 40 is the base of this cell, while heavily doped n-region 14 is the emitter; thus lamina 40 comprises a photovoltaic cell. Current is generated within lamina 40 when it is exposed to light. Electrical contact is made to both first surface 10 and second surface 62 of this cell. Wiring 57 is in electrical contact with second surface 62.

Example

Front and Back Contact, Photolithographic Wiring

Figure 6A:
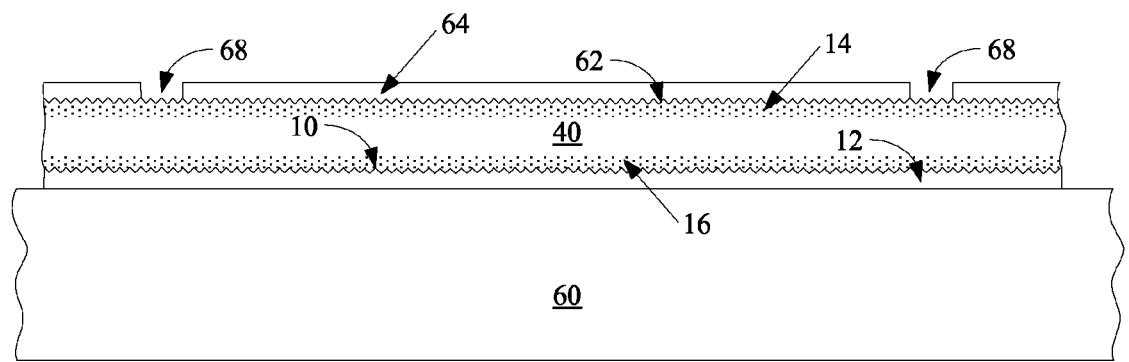
FIGS. 6a and 6b are cross-sectional views showing stages in formation of a photovoltaic cell according to another embodiment of the present invention.

It may be preferred to form wiring 57 by other methods. Referring to FIG. 6*a*, fabrication of this embodiment is the same as for the prior embodiment up to the point at which silicon nitride layer 64 has been formed on second surface 62. At this point a series of parallel trenches 68 are formed in silicon nitride layer 64, exposing the silicon of second surface 62 in each trench 68. Trenches 68 can be formed by any appropriate method, for example by photolithographic masking and etching. Optionally, a second diffusion doping step with an n-type dopant can be performed at this point, more heavily doping silicon exposed in trenches 68.

Figure 6B:
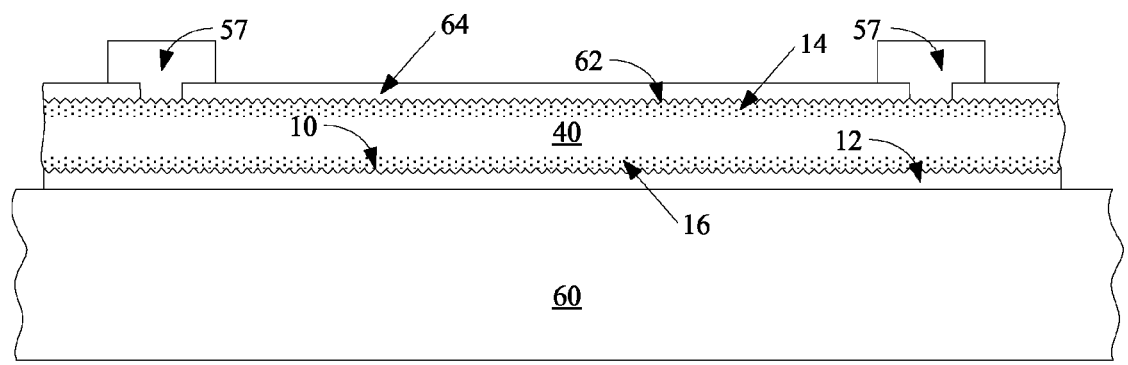

FIG. 6*b* shows wiring 57, which is formed contacting n-doped region 14 exposed in trenches 57. Wiring 57 can be formed by any convention means. It may be preferred to form a metal layer on silicon nitride layer 64, then form wiring 57 by photolithographic masking and etching. In an alternate embodiment, wiring 57 is formed by screen printing, for example to form aluminum wiring.

Example

Localized Rear Contact

Figure 7A:
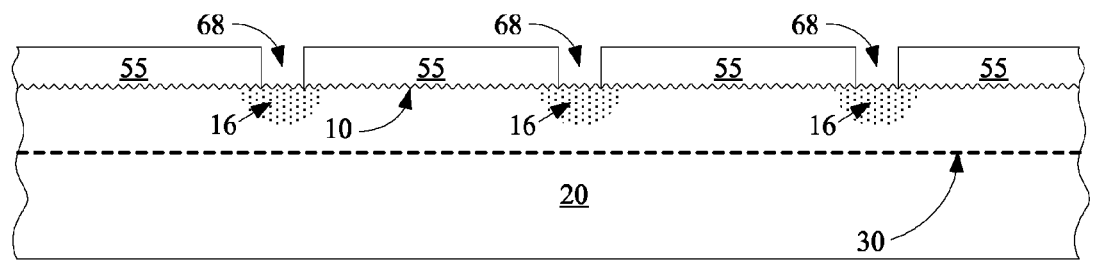
FIGS. 7a-7c are cross-sectional views showing stages in formation of a photovoltaic cell according to another embodiment of the present invention.

In another embodiment, electrical contact at the back surface of the cell is made locally. Referring to FIG. 7*a*, this embodiment begins with lightly p-doped wafer 20, which is optionally roughened at first surface 10 as in earlier embodiments. Dielectric layer 55, which will act as a diffusion barrier, is deposited on first surface 10. In some embodiments dielectric layer 55 is silicon nitride or $SiO_2$, and may be between about 1000 and about 1200 angstroms. Vias 68 are formed in silicon nitride layer 55, exposing first surface 10 in each via 68. Note that in preferred embodiments, vias 68 are vias, not trenches. A diffusion doping step is performed, doping exposed areas of first surface 10 with a p-type dopant and forming heavily doped p-type regions 16. In some embodiments this diffusion doping step may be omitted. Next gas ions are implanted as before, defining cleave plane 30.

Figure 7B:
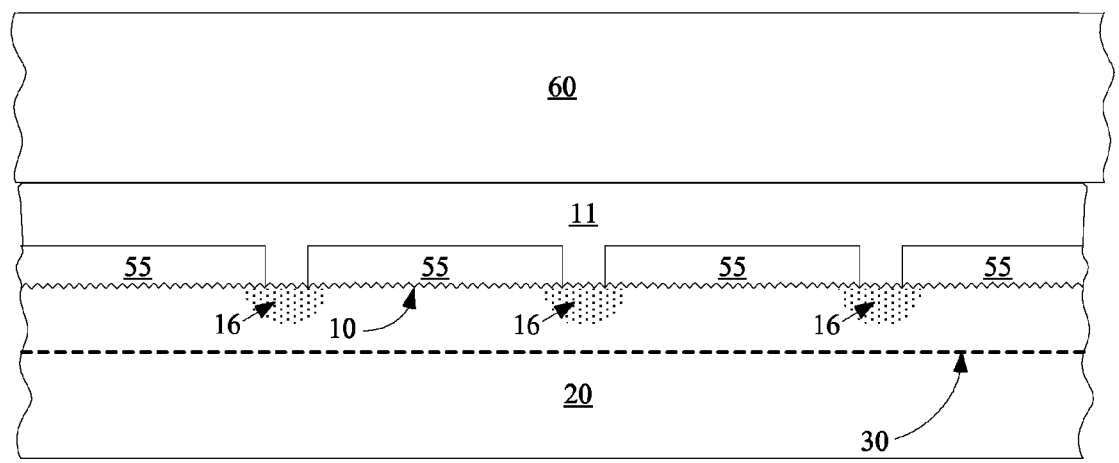

As shown in FIG. 7*b*, aluminum layer 11 is formed on silicon nitride layer 55, filling the vias and contacting heavily doped p-type regions 16. In some embodiments aluminum layer 11 may be about 1 micron thick. Next wafer 20 is affixed to substrate 60 at first surface 10.

Figure 7C:
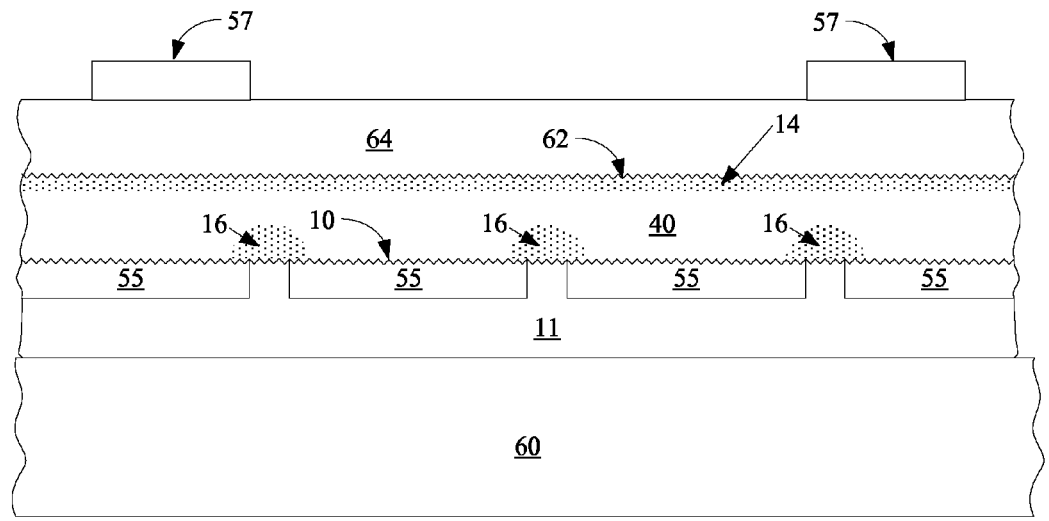

Turning to FIG. 7*c*, which shows the structure inverted with substrate 60 at the bottom, fabrication continues as in previous embodiments. Lamina 40 is formed by exfoliation from wafer 20, creating second surface 62. Second surface 62 may be roughened, as in prior embodiments. An n-doped region 14 is formed by diffusion doping at second surface 62. Elevated temperature during this diffusion doping step causes some aluminum from aluminum layer 11 to diffuse into lamina 40 where it contacts silicon at first surface 11, further doping p-doped regions 16. Antireflective layer 64 is formed on second surface 62. As in prior embodiments, a thin oxide layer (not shown) may have grown on second surface 62 during the diffusion doping step to form n-doped layer 14. Wiring 57 is formed, by screen printing, photolithography, or by some other method, completing the cell.

Example

Amorphous Emitter and Base Contacts

Figure 8A:
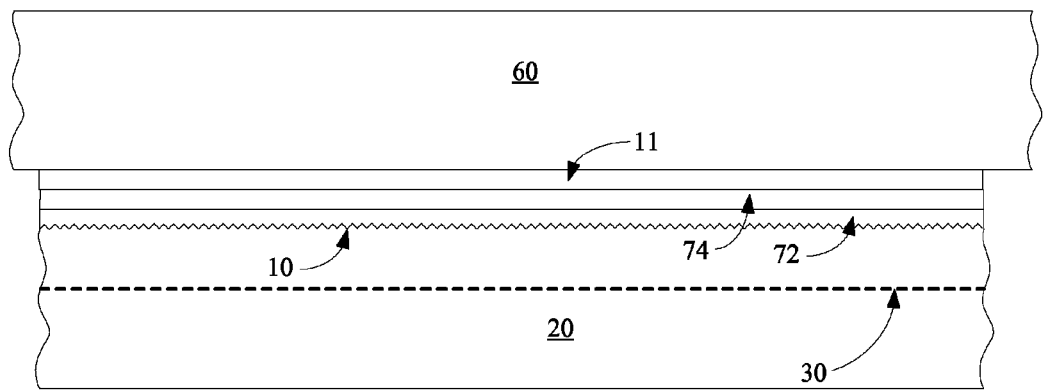
FIGS. 8a and 8b are cross-sectional views showing stages in formation of a photovoltaic cell according to yet another embodiment of the present invention.

In another embodiment, the heavily doped regions of the cell are formed in amorphous semiconductor layers. Turning to FIG. 8a, to form this cell, in one embodiment, original wafer 20 is lightly n-doped (as always, in alternate embodiments, conductivity types can be reversed.) First surface 10 of wafer 20 is optionally roughened as in prior embodiments. After cleaning first surface 10, a layer 72 of intrinsic (undoped) amorphous silicon is deposited on first surface 10, followed by a layer 74 of n-doped amorphous silicon by any suitable method, for example by plasma enhanced chemical vapor deposition (PECVD). The combined thickness of amorphous layers 72 and 74 may be between about 1000 and about 5000 angstroms, for example about 3000 angstroms. In one embodiment, intrinsic layer 72 is about 1000 angstroms thick, while n-type amorphous layer 74 is about 2000 angstroms thick. Gas ions are implanted through layers 74, 72 and into first surface 10 to form cleave plane 30 as in prior embodiments. It will be understood that the implant energy must be adjusted to compensate for the added thickness of amorphous layers 74 and 72.

A reflective, conductive metal 11 is formed on n-doped layer 74, on substrate 60, or both, as in prior embodiments, and wafer 20 is affixed to substrate 60 at first surface 10, with intrinsic layer 72, n-doped layer 74, and metal layer 11 intervening between them. Metal layer 11 can be aluminum, titanium, or any other suitable material. To facilitate eventual electrical connection to each cell, if metal layer 11 was deposited onto substrate 60, it may have been deposited in a pattern, such that the areas to which individual wafers are to be affixed are isolated from each other. These areas of metal 11 may extend for a short distance outside of the wafer area, so that electrical contact can be made to them. This patterning can be done, for example, by depositing through a shadow mask; or by etching metal 11 after it is deposited, for example, through a physical mask placed on substrate 60.

Figure 8B:
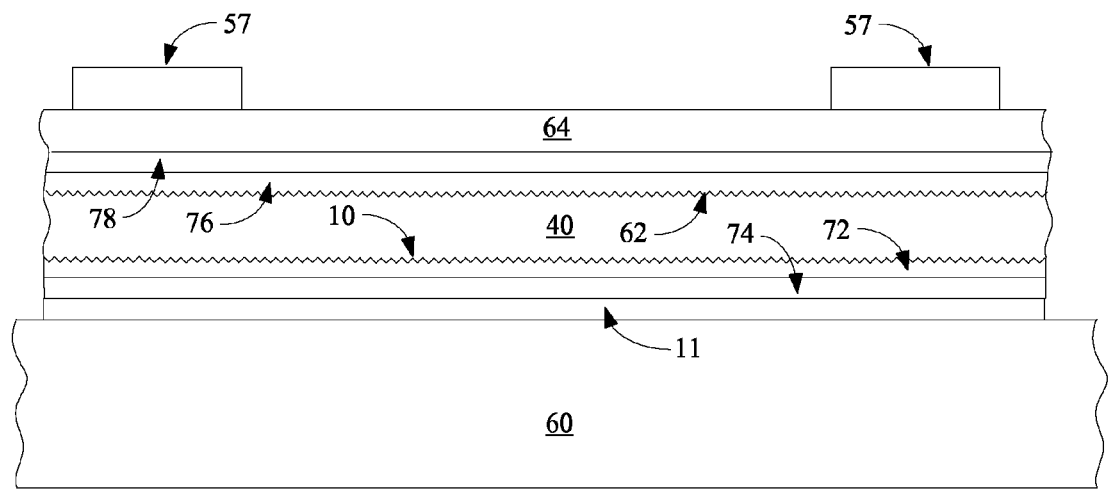

FIG. 8b shows the structure inverted, with substrate 60 at the bottom. Lamina 40 is exfoliated from wafer 20 along cleave plane 30, creating second surface 62. Second surface 62 is optionally roughened, and is cleaned. Intrinsic amorphous silicon layer 76 is deposited on second surface 62, followed by p-doped amorphous silicon layer 78. The thicknesses of intrinsic amorphous layer 76 and p-doped amorphous layer 78 may be about the same as intrinsic amorphous layer 72 and n-doped amorphous layer 74, respectively, or may be different. Next antireflective layer 64, which may be, for example, silicon nitride, is formed on p-type amorphous layer 78 by any suitable method. In alternative embodiments, antireflective layer 64 may be a transparent conductive oxide (TCO). If this layer is a TCO, it may be, for example, of indium tin oxide, tin oxide, titanium oxide, zinc oxide, etc. A TCO will serve as both a top electrode and an antireflective layer and may be between about 500 and 1500 angstroms thick, for example, about 900 angstroms thick.

Finally wiring 57 is formed on antireflective layer 64. Wiring 57 can be formed by any appropriate method. In a preferred embodiment, wiring 57 is formed by screen printing.

In this embodiment, lamina 40 is the base, or a portion of the base, of a photovoltaic cell. Heavily doped p-type amorphous layer 78 is the emitter, or a portion of the emitter. Amorphous layer 76 is intrinsic, but in practice, amorphous silicon will include defects that cause it to behave as if slightly n-type or slightly p-type. If it behaves as if slightly p-type, then, amorphous layer 76 will function as part of the emitter, while if it behaves as if slightly n-type, it will function as part of the base.

As will be described, preferably a plurality of these cells is formed at one time onto a single substrate 60. Deposition of p-type amorphous layer 78 and, if it was a TCO, of antireflective layer 64 onto multiple laminae affixed to the same substrate 60 in the same deposition step leaves adjacent laminae electrically connected through these layers. These layers must be electrically separated before formation of wiring 57, for example by etching these layers through a physical mask that is placed on the substrate/lamina assembly, or by ablating the layers away with a laser.

To finish a panel, the individual cells should be wired together, typically in a series configuration, in which the N+ electrode of one cell is connected to the P+ electrode of the adjacent cell. This can be done by patterning wiring 57 during its formation so as to make contact to metal surfaces already patterned on substrate 60, if any. Alternatively, wiring 57 can be connected to metal patterns in substrate 60 by individual soldering. If there is no metal patterning in substrate 60, a laser can be used to ablate the entire lamina 40 from a small area, for example about a square cm, of each lamina 40, exposing the metal underneath. This exposed metal can be connected to wiring 57 of the neighboring lamina by soldering, for example.

Example

Back-Contact Cell

Figure 9A:
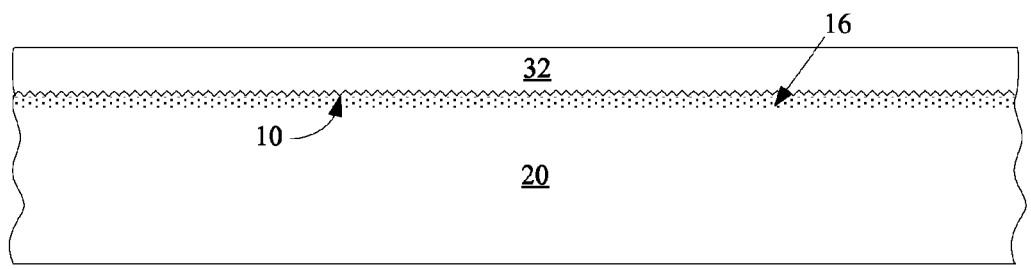
FIGS. 9a-9d are cross-sectional views showing stages in formation of a photovoltaic cell according to an embodiment of the present invention.
Figure 9B:
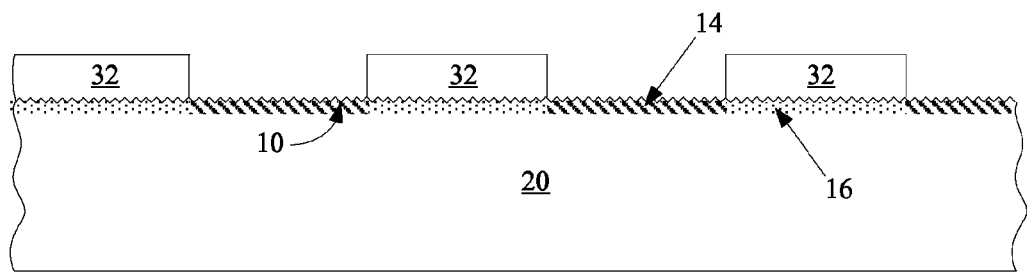

Turning to FIG. 9a, another embodiment begins with lightly doped wafer 20 of either type; this example will describe initial wafer 20 as lightly p-doped, but it will be understood that either conductivity type can be used. First surface 10 is optionally roughened, and doped with a first conductivity type dopant, for example p-type, forming p-doped region 16. Doping may be performed by diffusion doping. A diffusion barrier 32 is deposited on first surface 10; diffusion barrier 32 may be Silicon nitride. Turning to FIG. 9b, areas of silicon nitride layer 32 are removed, exposing portions of first surface 10. A second doping step is performed, counterdoping the exposed areas of first surface 10 to a second conductivity type opposite the first, for example n-type, forming n-doped regions 14, which are depicted in cross-hatching. Preferably both n-doped regions 14 and p-doped regions 16 are doped to a concentration of at least $10^{18}$ atoms/cm$^3$.

Figure 9C:
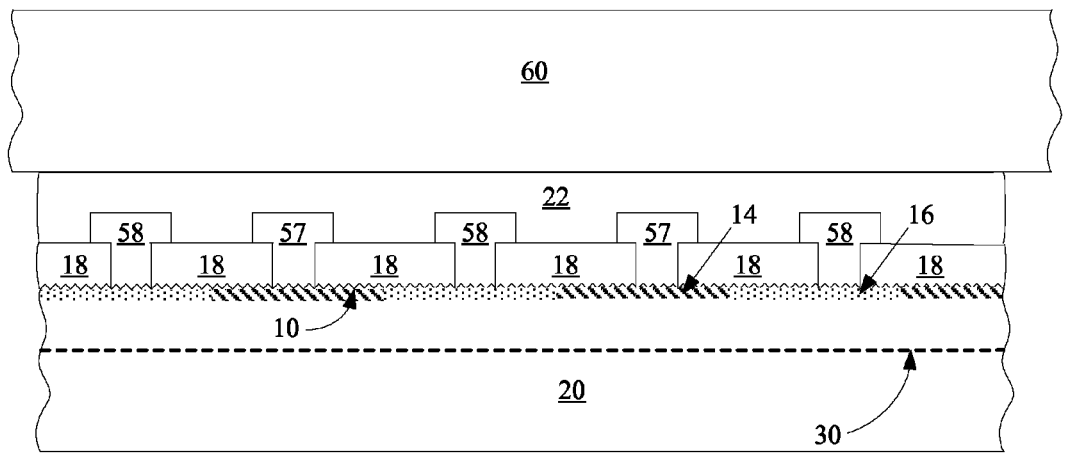

Turning to FIG. 9c, next silicon nitride layer 32 is removed, and ions are implanted to define a cleave plane 30. A dielectric layer 18, for example silicon dioxide, is deposited or grown on first surface 10. Vias are etched in dielectric layer 18, and wiring is formed on dielectric layer 18. Wiring is formed in two electrically isolated sets; one wiring set 57 contacts n-doped regions 14, while another wiring set 58 contacts p-doped regions 16. Wiring sets 57 and 58 may be formed by depositing a metal and patterning it photolithographically. A dielectric 22 such as spin-on glass fills gaps between wiring sets 57 and 58 and makes a relatively planar surface. This surface is affixed to substrate 60. Exfoliation is cleaner and more controllable when the surface is planar and uniformly affixed to the receiver, in this case substrate 60.

Figure 9D:
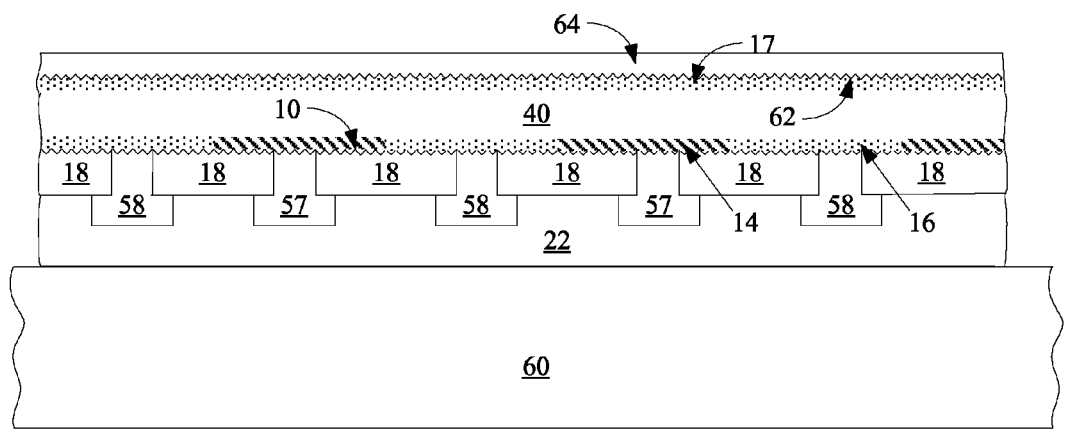

FIG. 9*d* shows the structure inverted with substrate 60 on the bottom. Lamina 40 is cleaved from wafer 20 along cleave plane 30, forming second surface 62. Second surface 62 is preferably roughened by any known method. In some embodiments, second surface 62 is doped to the same conductivity type as that of initial wafer 20. In this example, initial wafer 20 was n-type; thus this surface may be doped with an n-type dopant by diffusion doping to form n-doped region 17. It may be preferred to flow some oxygen during this diffusion doping step, which will cause a thin silicon dioxide layer (not shown) to form; this thin silicon dioxide layer will help passivate dangling bonds at second surface 62, reducing recombination.

Next antireflective layer 64 is formed; antireflective layer 64 may be silicon nitride. Silicon nitride deposited by PECVD will include some hydrogen, and this hydrogen will tend to passivate these dangling bonds at second surface 62, decreasing recombination. Deposition conditions may be chosen to increase the hydrogen content of silicon nitride layer 64 to increase the amount of hydrogen for this purpose.

In this embodiment, electrical contact in the form of wiring sets 57 and 58 is made only to first surface 10. The p-n diode junction is formed between heavily doped p-regions 16 and the lightly n-doped body of lamina 40. Photocurrent flows between n-doped regions 14 and p-doped regions 16. Thus no electrical contact need be made to second surface 62. In this embodiment, the base of the photovoltaic cell is the lightly n-doped body of lamina 40, while the emitter is the combined heavily doped p-type regions 16; thus lamina 40 comprises both the base and emitter of a photovoltaic cell. As in all of the embodiments described in this section, current is generated within lamina 40 when it is exposed to light.

Example

Exfoliation to Superstrate with TCO

In the embodiments so far described, the lamina is exfoliated to a substrate, where the first surface, the original surface of the donor body, is the back surface of the finished cell, and the second surface created by exfoliation is the surface where light enters the cell. The lamina may instead be exfoliated to a superstrate, where the original surface of the donor body is the surface where light enters the cell, while the second surface, created by exfoliation, is the back surface of the finished cell. Two examples will be provided, though many others can be imagined.

Figure 10A:
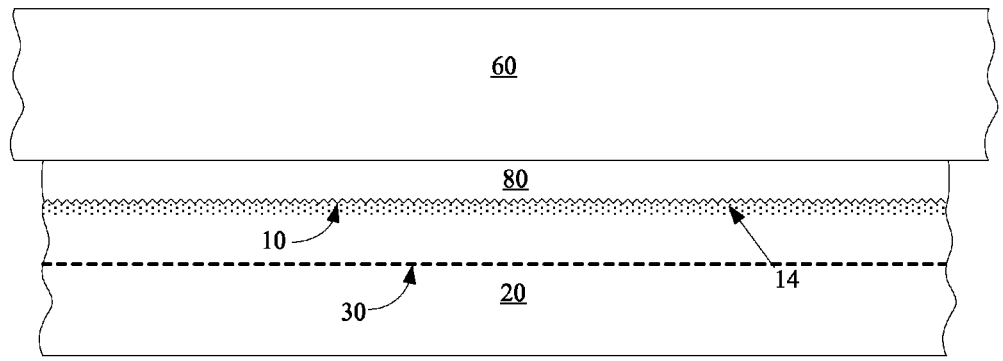
FIGS. 10a and 10b are cross-sectional views showing stages in formation of a photovoltaic cell according to still another embodiment of the present invention.

Turning to FIG. 10*a*, in this example semiconductor donor body 20 is a lightly p-doped silicon wafer. First surface 10 of wafer 20 is optionally textured as in prior embodiments. Next a doping step, for example by diffusion doping, forms n-doped region 14. If oxygen is present during this doping step, a thin oxide (not shown) will grow at first surface 10. It will be understood that, as in all embodiments, conductivity types can be reversed. Gas ions are implanted through first surface 10 to define cleave plane 30.

First surface 10 is cleaned, removing any oxide formed during diffusion doping. In the present example, TCO 80 will intervene between first surface 10 and superstrate 60. This TCO 80 is indium tin oxide, titanium oxide, zinc oxide, or any other appropriate material, and can be deposited on first surface 10, on superstrate 60, or both. As TCO 80 serves as both a contact and as an antireflective coating, its thickness should be between about 500 and about 1500 angstroms thick, for example about 900 angstroms thick. Wafer 20 is affixed to superstrate 60 at first surface 10. Note superstrate 60 is a transparent material such as glass.

Figure 10B:
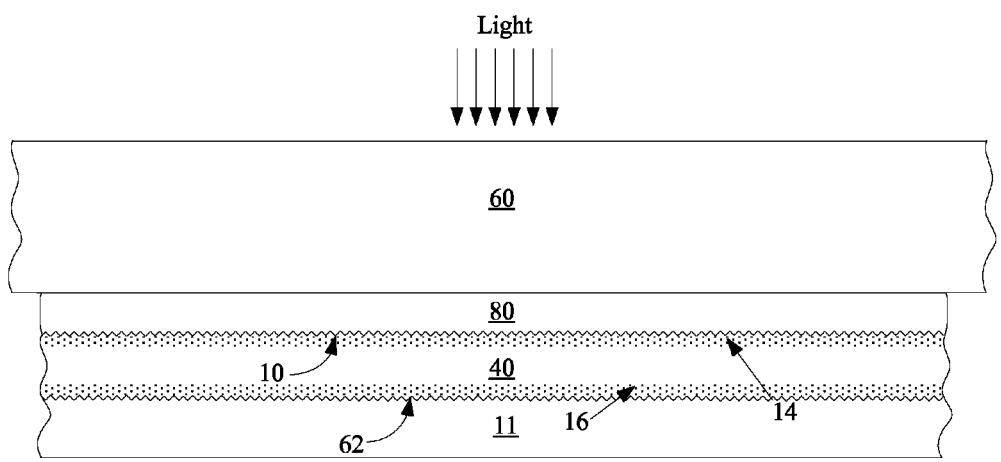

Turning to FIG. 10*b*, lamina 40 is exfoliated from wafer 20 at cleave plane 30, creating second surface 62. Second surface 62 is optionally textured. Conductive layer 11 is deposited on second surface 62. Conductive layer 11 is preferably a metal, for example aluminum. If conductive layer 11 is aluminum, an anneal forms p-doped layer 16. If some other material is used for conductive layer 11, p-doped layer 16 must be formed by a diffusion doping step before conductive layer 11 is formed.

Aluminum layer 11 can be formed by many methods, for example by sputtering with a shadow mask. If the method of formation of aluminum layer 11 leaves adjacent cells electrically connected, intervening aluminum must be removed to electrically isolate them.

FIG. 10*b* shows the completed cell with superstrate 60 at the top, as during operation. Incident light falls on superstrate 60 and enters the cell at first surface 62.

Example

Exfoliation to Superstrate with Wiring

Figure 11A:
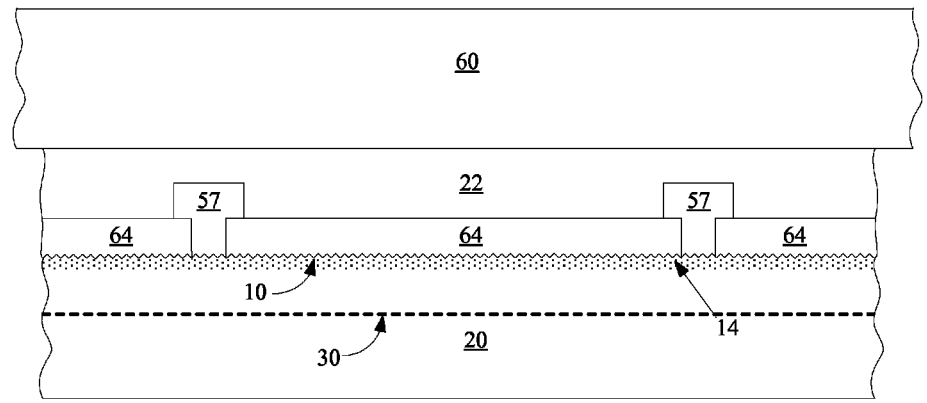
FIGS. 11a and 11b are cross-sectional views showing stages in formation of a photovoltaic cell according to still another embodiment of the present invention.

As in the prior superstrate embodiment, in FIG. 11*a*, lightly p-doped wafer 20 is optionally textured at first surface 10, then doped to form n-type region 14. Implantation of gas ions at first surface 10 forms cleave plane 30.

In this example, antireflective layer 64, for example silicon nitride, is formed on first surface 10, for example by PECVD. Trenches are formed in silicon nitride layer 64, for example by photolithography or by laser scribing, to expose first surface 10. Wiring 57 is formed contacting n-doped region 14. Wiring can be formed of any appropriate conductive material, for example aluminum, by any appropriate method, for example photolithographic masking and etching.

Next dielectric 22 such as spin-on glass fills gaps between wiring 57 and makes a relatively planar surface. This surface is affixed to superstrate 60. Superstrate 60 is transparent.

Figure 11B:
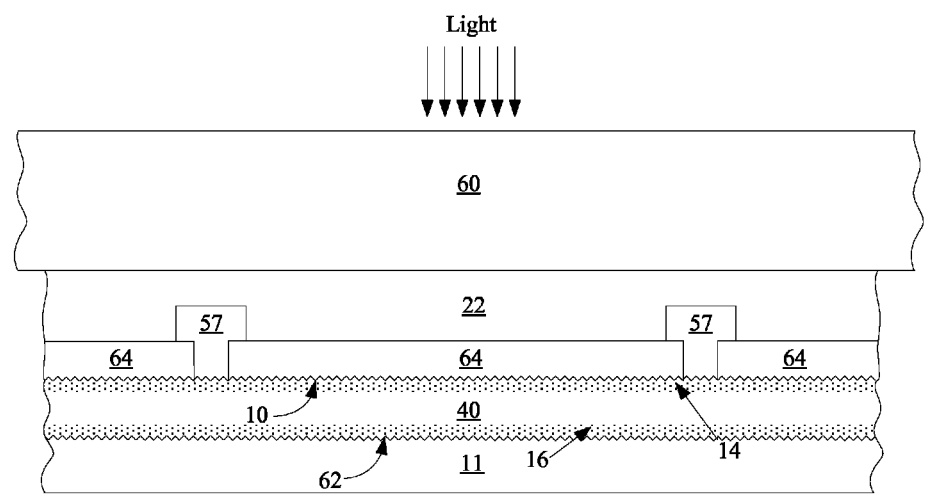

Turning to FIG. 11*b*, lamina 40 is exfoliated from wafer 20 at cleave plane 30, creating second surface 62. At this point fabrication proceeds as in the prior embodiment: Second surface 62 is optionally textured. In some embodiments a diffusion doping step is performed, forming p-doped region 16, while in other embodiments this step can be omitted. Conductive layer 11, preferably aluminum, is formed on second surface 62 and an anneal will form p-doped region 16. FIG. 11*b* shows the completed cell with superstrate 60 at the top, as it will be during cell operation.

Example

Multijunction Cells

Figure 12:
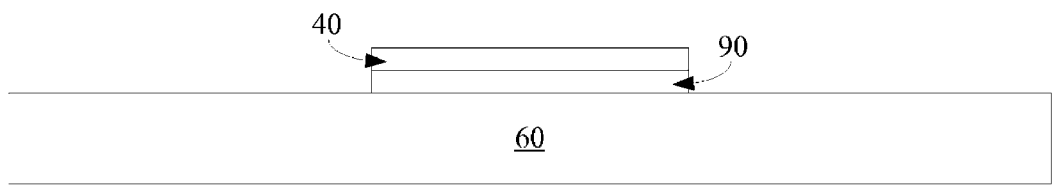
FIGS. 12 and 13 are cross-sectional views of alternative embodiments in which a lamina formed according to the present invention is a portion of a tandem or multijunction photovoltaic cell.
Figure 13:
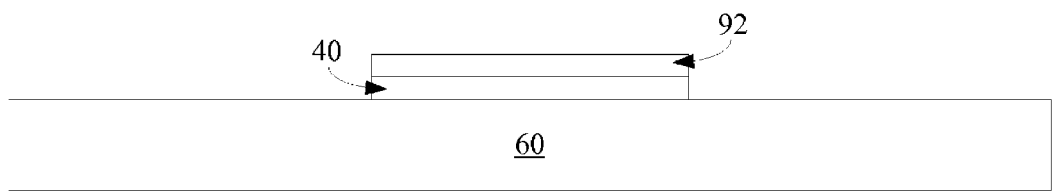

In alternative embodiments, a lamina formed according to the present invention may serve as a portion of a tandem or multijunction cell. As shown in FIG. 12, the substrate 60 to which lamina 40 is affixed may already include a photovoltaic cell or portion of a cell 90; incident light will fall first on lamina 40, then pass through it to cell 90. Alternatively, as shown in FIG. 13, another cell or portion of a cell 92 may be formed above lamina 40, such that incident light travels first through cell 92, then through lamina 40. In other embodiments, there may be one or more cells or semiconductor layers above and/or below lamina 40. The other cells can be formed of the same semiconductor material as lamina 40 or of a different semiconductor material; examples include germanium, silicon germanium, GaAs, CdTe, InN, etc. Lamina 40 can include at least a portion of the base, or of the emitter, of a photovoltaic cell, or both.

Lamina 40 and additional cells or semiconductor layers in a tandem or multijunction cell may be the same semiconductor material, but may have a different degree or grade of crystallinity. For example, lamina 40 may be monocrystalline silicon while an additional cell or semiconductor layer is polycrystalline, multicrystalline, microcrystalline, or amorphous silicon, or vice versa. The additional cells forming the tandem or multifunction cell can be formed in a variety of ways, for example by deposition, by evaporation, by epitaxial growth, by cleaving additional laminae according to the present invention, or by any other suitable methods.

A variety of embodiments has been provided for clarity and completeness. Clearly it is impractical to list all embodiments. Other embodiments of the invention will be apparent to one of ordinary skill in the art when informed by the present specification.

After formation of a first lamina, the semiconductor donor body may be subjected a second time to the implant and exfoliation processes just described to form a second lamina. This second lamina may similarly be affixed to a receiver and comprise, or be a portion of, a photovoltaic cell, or may be used for a different purpose. As can be imagined, depending on the thickness of the laminae and the thickness of the original donor body, many laminae may be formed, until the donor body is too thin to handle safely. It may be preferred to form one or more laminae, then resell the donor body for another purpose. For example, if a donor body is a monocrystalline silicon wafer having a starting thickness of 400 microns, laminae may be formed by the methods described until the thickness of the donor wafer has been reduced to, for example, about 350 microns. For many applications, there is no practical difference between a 400-micron-thick wafer and one that is 350 micron thick; thus the wafer may be resold with little or no loss of commercial value.

For example, given a semiconductor donor wafer less than about 1000 microns, one, two, three, four, or more laminae can be cleaved from it. Each lamina may have the thicknesses described, for example 20 microns or less. When the final cleaving step has been performed, the donor wafer is preferably at least 180 microns thick. A wafer at least 180 microns thick can still be used for other commercial purposes.

It will be appreciated that because one or more laminae can be formed from a wafer without substantially decreasing the value of the donor wafer, the material cost is dramatically reduced. Using the methods of the present invention, materials that have previously been considered impractical for use in a photovoltaic cell now become economically viable. Float-zone silicon wafers, for example, are very high-quality wafers which have been heat-treated to remove impurities. Typically float-zone silicon is too expensive for economical use in silicon photovoltaic cells. Using methods of the present invention, however, laminae of float-zone silicon can be cheaply produced, improving the efficiency of the resulting photovoltaic cell. After cleaving one or more laminae from the float-zone silicon wafer, the wafer can be resold and used for another purpose. Other higher-cost source materials, such as wafers of semiconductor materials besides silicon, for example monocrystalline GaAs or mono- or multicrystalline germanium wafers, may also be advantageous.

Figure 14:
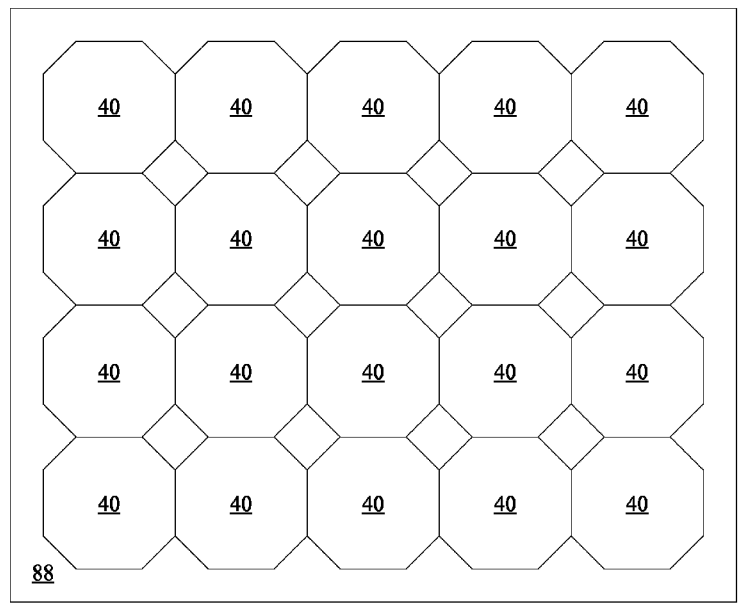
FIG. 14 is a plan view of a photovoltaic module comprising a plurality of thin photovoltaic cells according to an embodiment of the present invention.

Turning to FIG. 14, a photovoltaic module including multiple laminae formed by methods according to the present invention may be fabricated. A plurality of donor bodies such as silicon wafers can be processed as described, implanted with gas ions, bonded or otherwise affixed to a single receiver 88 which is a substrate or a superstrate, and a lamina 40 cleaved from each donor wafer in a single cleaving step. The module comprises the receiver 88 and the laminae 40. Such a module may include a plurality of laminae 40, for example two, twelve, or more, for example between 36 and 72, or more, or any other suitable number. Each lamina 40 comprises or is a portion of a photovoltaic cell, for example at least a portion of its base or emitter. In preferred embodiments, the photovoltaic cells on the module are electrically connected; they may be connected in series, as is well known in the art.

Figure 15A:
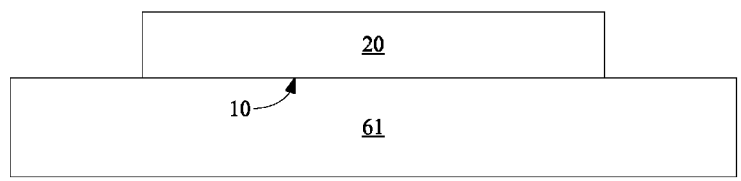
FIGS. 15a-15c are cross-sectional views showing stages in formation of an alternative embodiment of the present invention in which a lamina is transferred between a substrate and a superstrate.
Figure 15B:
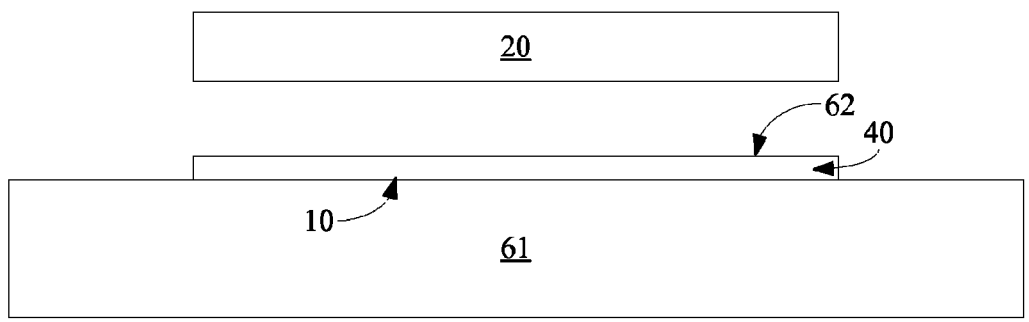
Figure 15C:
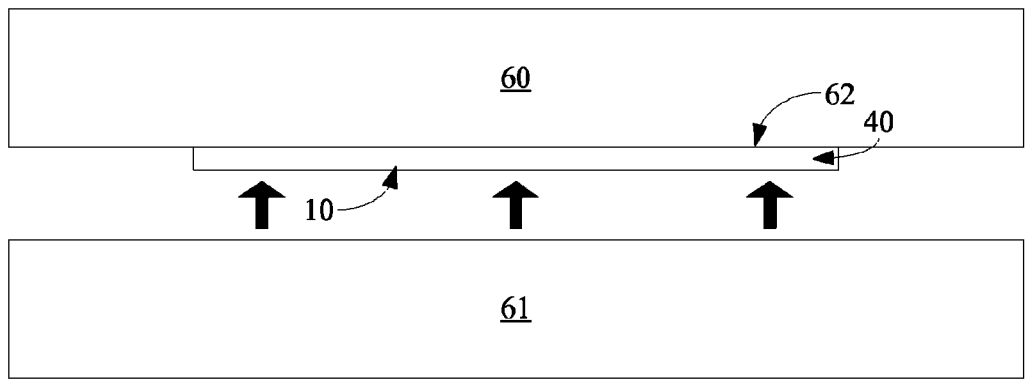

In other embodiments of the present invention, it may be preferred to transfer the lamina between two or more receivers to process each side. For example, referring to FIG. 15a, wafer 20 could be affixed at its first surface 10 to a temporary, high-temperature-tolerant receiver 61. As shown in FIG. 15b, after cleaving produces lamina 40 having a second surface 62, the second surface 62 could be exposed to high temperature processes, for example diffusion doping, without damaging the temporary receiver 61. Turning to FIG. 15c, when processing is complete, lamina 40 could be removed from temporary receiver 61 and transferred to a final receiver 60. It is anticipated that multiple transfers would add cost and reduce yield, however, so these embodiments, while within the scope of the invention, are generally less preferred.

Formation of a lamina affixed to a semiconductor, glass, metal, or polymer receiver has been described in which the lamina comprises or is a portion of a photovoltaic cell. In alternative embodiments, the lamina may or may not be formed of a semiconductor material, and may be used for different purposes. The methods of the present invention may be useful in any circumstance in which a thin lamina of material is to be affixed to a receiver; the receiver may be semiconductor, metal, polymer, or some non-insulating material. For example, a semiconductor lamina of one conductivity type or dopant concentration may be affixed to a semiconductor receiver, or a receiver having a semiconductor layer, doped to a different conductivity type or a different dopant concentration.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:
1. A photovoltaic cell comprising:
   a monocrystalline semiconductor silicon lamina having a first surface and a second surface opposite the first, the lamina having a thickness between about 1 micron and about 20 microns between the first and second surfaces;
   a dielectric layer in contact with the first surface; and
   a metal layer in contact with the dielectric layer, the metal layer contacting the first surface through vias formed through the dielectric layer,
   wherein the dielectric layer is disposed between the lamina and the metal layer, and the metal layer is disposed between the dielectric layer and a rear support substrate providing support to the lamina, wherein the metal layer is continuous between all the vias, and wherein the photovoltaic cell comprises the lamina.

2. The photovoltaic cell of claim 1 wherein the dielectric layer comprises silicon nitride or silicon dioxide.

3. The photovoltaic cell of claim 1 wherein the metal layer comprises aluminum.

4. The photovoltaic cell of claim 1 further comprising an antireflective coating in contact with the second surface.

5. The photovoltaic cell of claim 1 wherein the monocrystalline crystalline silicon lamina has a thickness between about 1 micron and about 5 microns.

6. The photovoltaic cell of claim 1 wherein at least portions of the second surface are heavily n-doped or p-doped.

7. The photovoltaic cell of claim 1 wherein the second surface has been roughened.

8. The photovoltaic cell of claim 1 wherein the rear support substrate comprises glass.

* * * * *